United States Patent
Ohira et al.

(10) Patent No.: US 8,078,929 B2
(45) Date of Patent: Dec. 13, 2011

(54) OPTICAL LINE TERMINAL AND OPTICAL NETWORK TERMINAL

(75) Inventors: Masaki Ohira, Yokohama (JP); Taro Tonoduka, Chigasaki (JP)

(73) Assignee: Hitachi, Ltd., Tokyo (JP)

( * ) Notice: Subject to any disclaimer, the term of this patent is extended or adjusted under 35 U.S.C. 154(b) by 1141 days.

(21) Appl. No.: 11/822,017

(22) Filed: Jun. 29, 2007

(65) Prior Publication Data

US 2008/0163021 A1    Jul. 3, 2008

(30) Foreign Application Priority Data

Aug. 30, 2006 (JP) ................................. 2006-234108

(51) Int. Cl.
*G06F 11/00* (2006.01)
(52) U.S. Cl. ....................................................... 714/746
(58) Field of Classification Search .................... 714/746
See application file for complete search history.

(56) References Cited

U.S. PATENT DOCUMENTS

| | | | | |
|---|---|---|---|---|
| 6,356,555 | B1* | 3/2002 | Rakib et al. | 370/441 |
| 7,024,616 | B2 | 4/2006 | Ohira et al. | |
| 7,421,210 | B2* | 9/2008 | Miyazaki | 398/188 |
| 2003/0156603 | A1* | 8/2003 | Rakib et al. | 370/485 |
| 2005/0149821 | A1 | 7/2005 | Lee et al. | |
| 2009/0162055 | A1* | 6/2009 | Sakamoto et al. | 398/35 |

FOREIGN PATENT DOCUMENTS

| | | |
|---|---|---|
| JP | 06-260943 | 9/1994 |
| JP | 2005-512183 A | 4/2005 |
| JP | 2006-014228 A | 1/2006 |
| WO | WO 03/048918 A1 | 6/2003 |

OTHER PUBLICATIONS

United States Office Action issued in U.S. Appl. No. 11/822,543, dated Dec. 23, 2009.

* cited by examiner

*Primary Examiner* — Scott Baderman
*Assistant Examiner* — Enam Ahmed
(74) *Attorney, Agent, or Firm* — McDermott Will & Emery LLP

(57) ABSTRACT

There are provided an optical line terminal and an optical network terminal, which can process with the same forward error correction code even if an EFC frame size of G-PON descending signals is different between two types of 255 and 120. The optical network terminal includes a photoelectric converter, a PON transceiver, and a physical layer. The PON transceiver includes an error correction code encoder including a shortening compensation parameter table and a shortening compensation calculator for calculating compensated data by referring to the shortening compensation parameter table. Also the optical line terminal includes a photoelectric converter, a PON transceiver, and a physical layer. The optical line terminal includes an error correction code encoder including a shortening compensation parameter table and a shortening compensation calculator for calculating compensated data by referring to the shortening compensation parameter table.

8 Claims, 30 Drawing Sheets

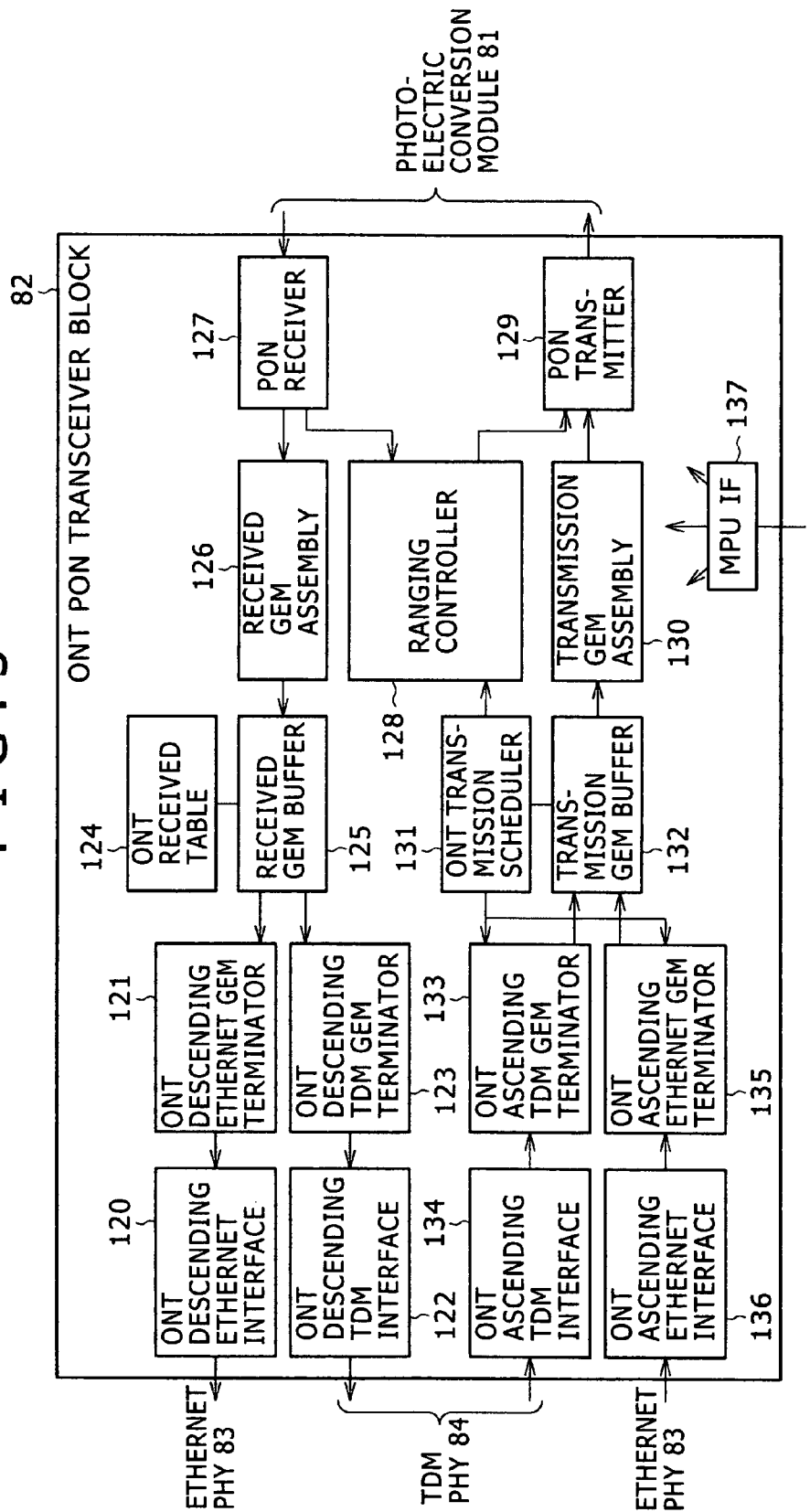

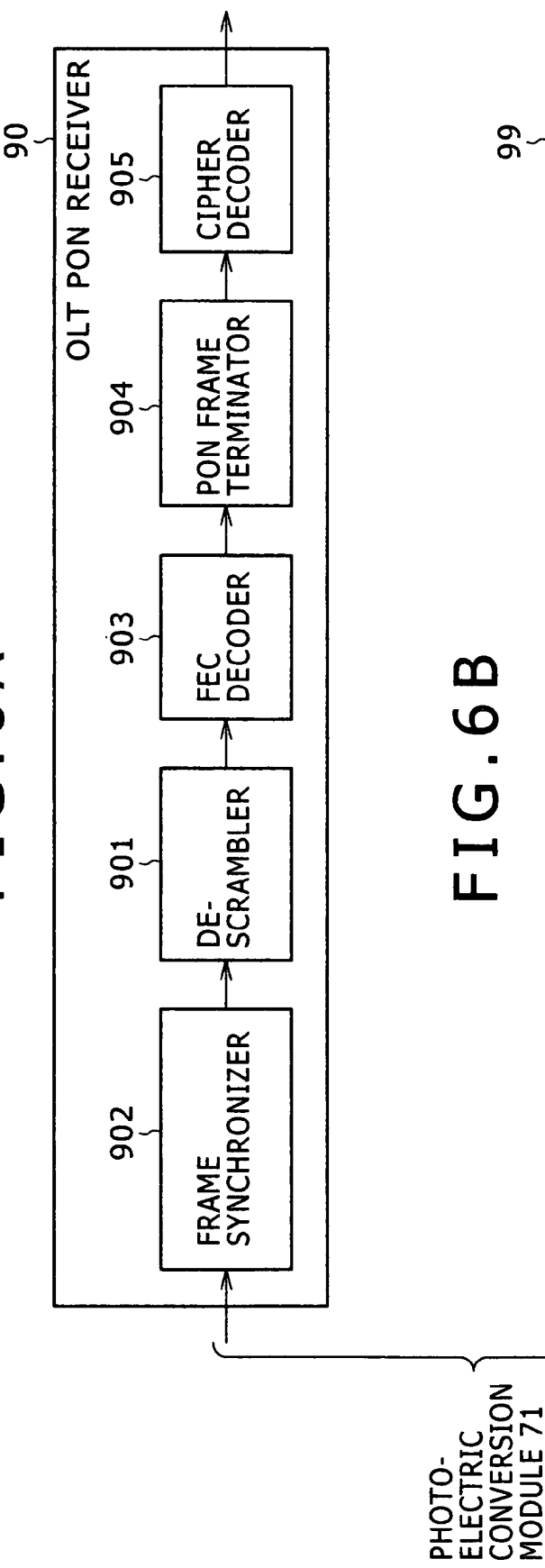
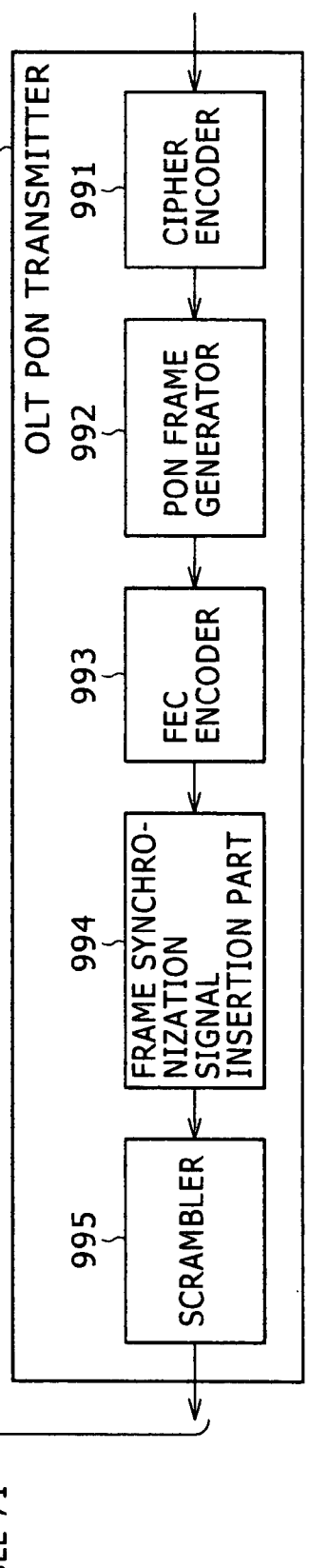
FIG.6A — OLT PON RECEIVER 90: 902 FRAME SYNCHRONIZER → 901 DE-SCRAMBLER → 903 FEC DECODER → 904 PON FRAME TERMINATOR → 905 CIPHER DECODER
FIG.6B — OLT PON TRANSMITTER 99: 991 CIPHER ENCODER → 992 PON FRAME GENERATOR → 993 FEC ENCODER → 994 FRAME SYNCHRONIZATION SIGNAL INSERTION PART → 995 SCRAMBLER
PHOTO-ELECTRIC CONVERSION MODULE 71

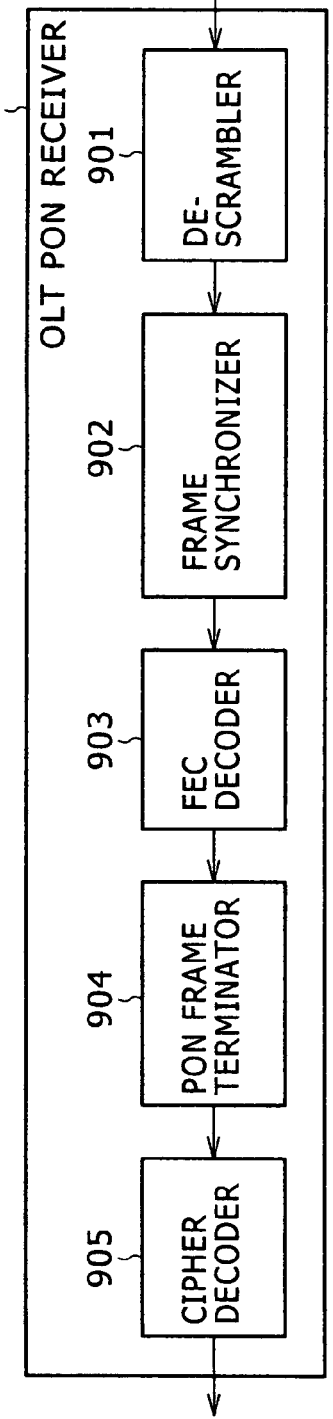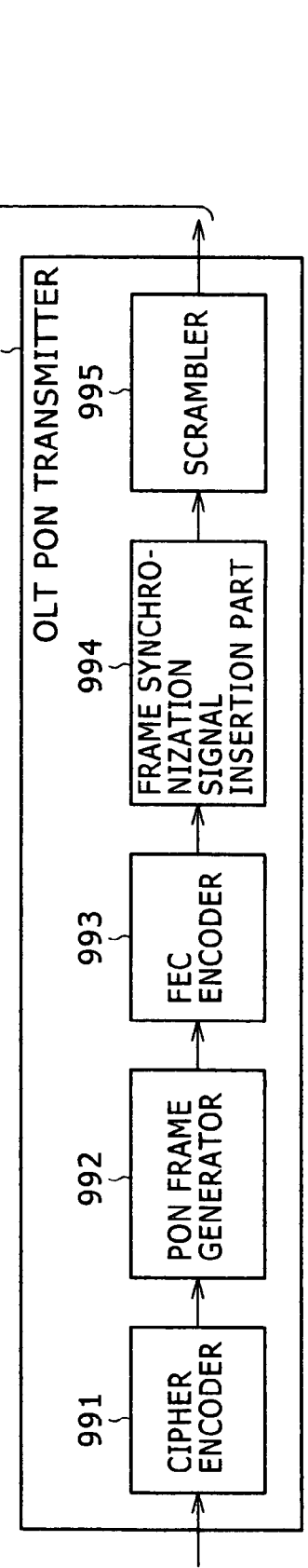

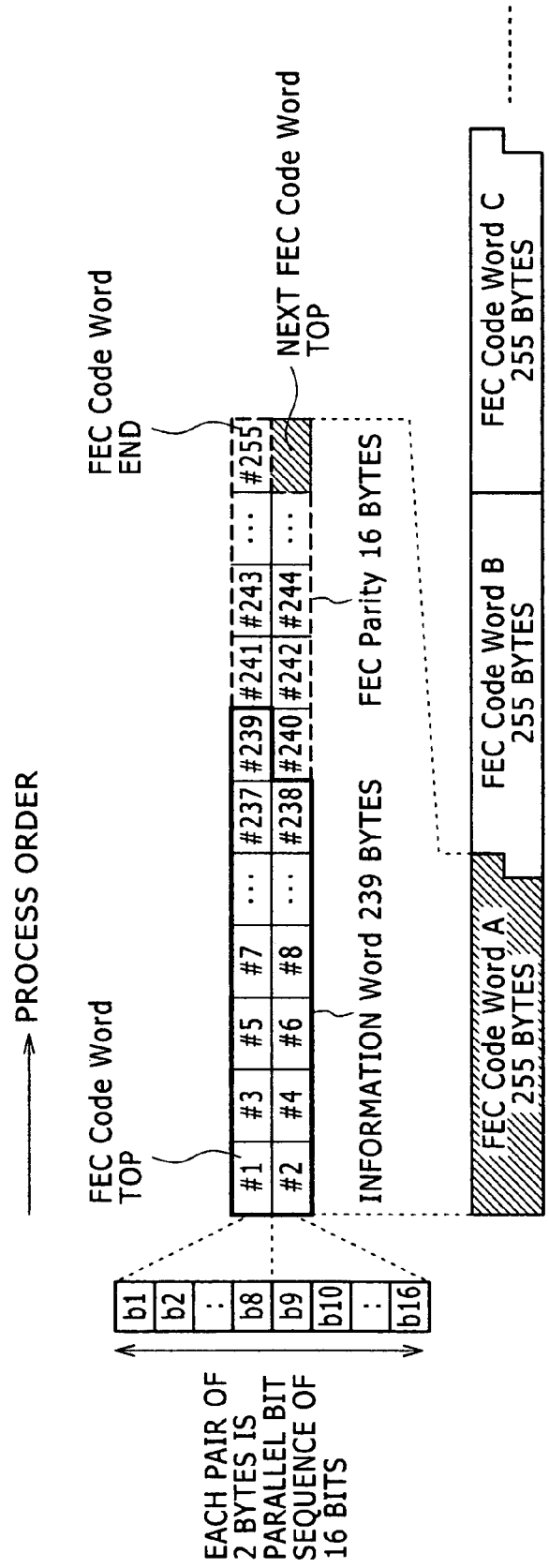

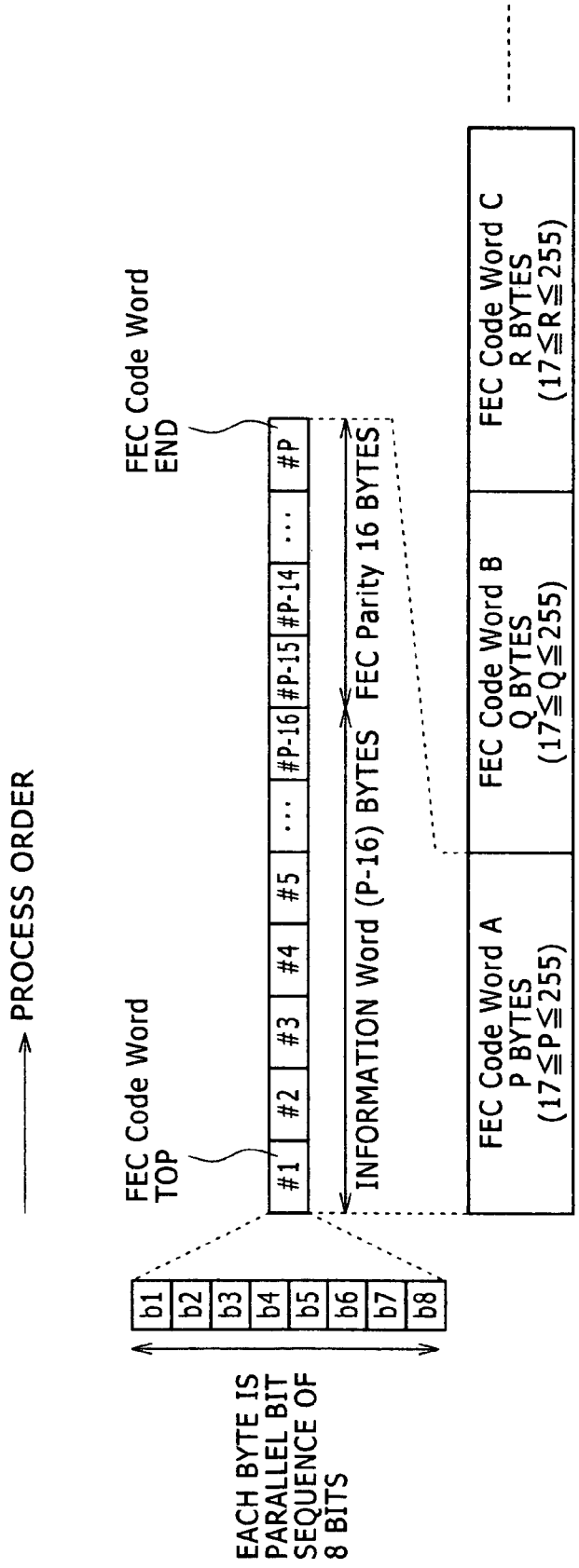

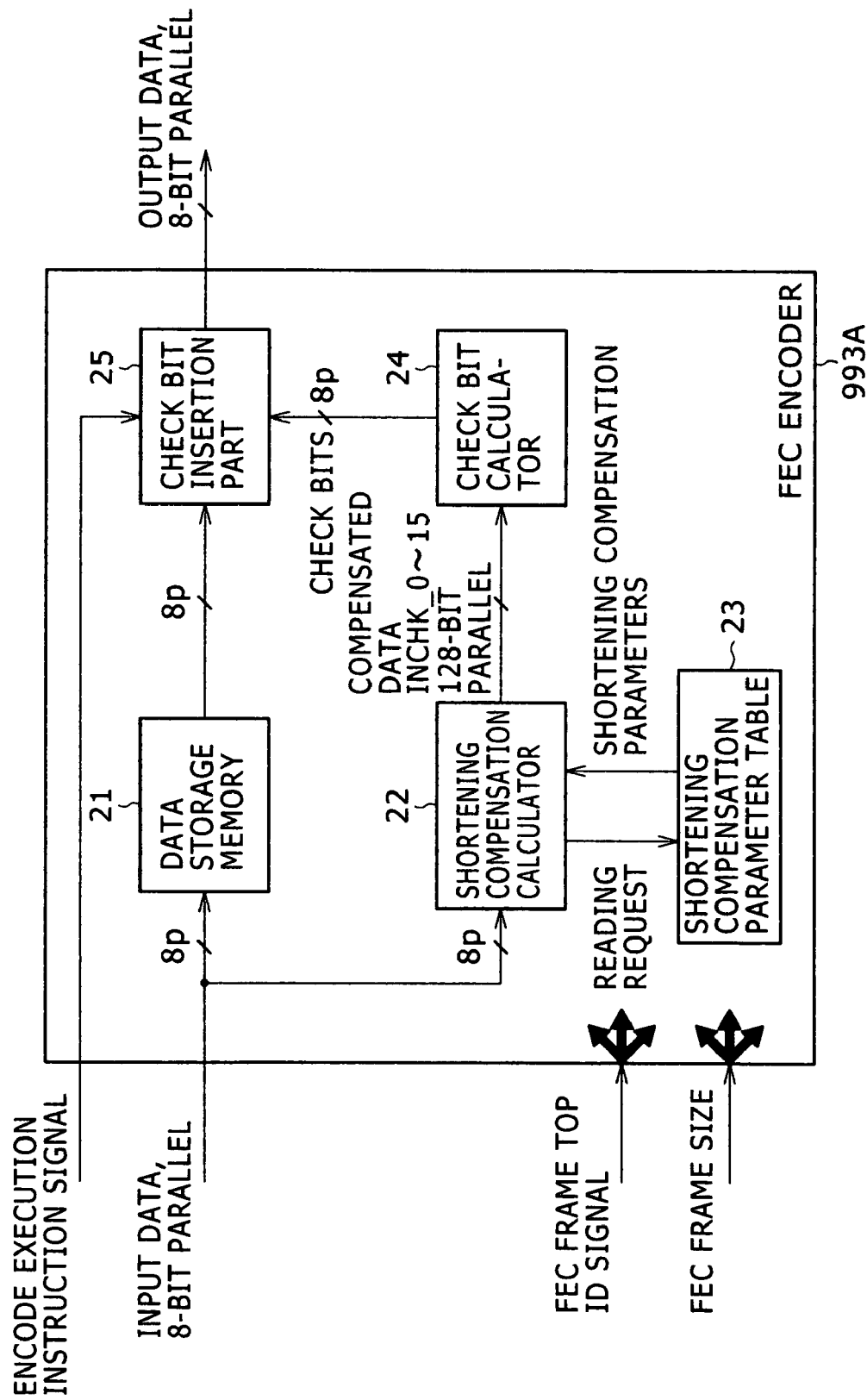

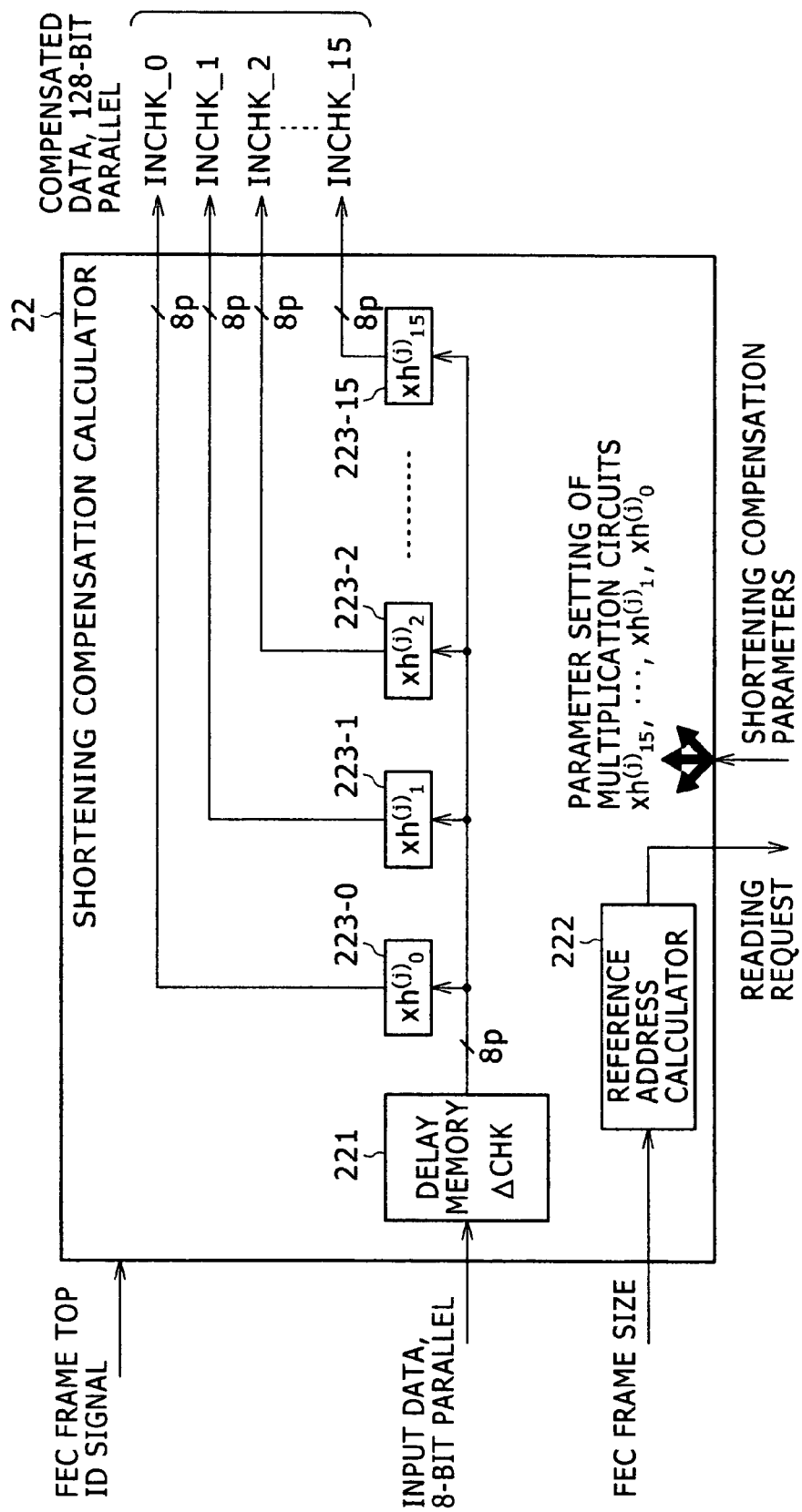

FIG.11A

SHORTENING COMPENSATION PARAMETER TABLE

READING REQUEST ↓

SHORTENING COMPENSATION PARAMETERS ↑

23A

| ADDRESS | CONTENT | | | | | |
|---------|---------|---------|-----|---------|---------|---------|
| 0 | $xh^{(0)}_{15}$ | $xh^{(0)}_{14}$ | ... | $xh^{(0)}_2$ | $xh^{(0)}_1$ | $xh^{(0)}_0$ |
| 1 | $xh^{(1)}_{15}$ | $xh^{(1)}_{14}$ | ... | $xh^{(1)}_2$ | $xh^{(1)}_1$ | $xh^{(1)}_0$ |
| 2 | $xh^{(2)}_{15}$ | $xh^{(2)}_{14}$ | ... | $xh^{(2)}_2$ | $xh^{(2)}_1$ | $xh^{(2)}_0$ |
| 3 | $xh^{(3)}_{15}$ | $xh^{(3)}_{14}$ | ... | $xh^{(3)}_2$ | $xh^{(3)}_1$ | $xh^{(3)}_0$ |
| 4 | $xh^{(4)}_{15}$ | $xh^{(4)}_{14}$ | ... | $xh^{(4)}_2$ | $xh^{(4)}_1$ | $xh^{(4)}_0$ |
| ⋮ | ⋮ | ⋮ | ... | ⋮ | ⋮ | ⋮ |
| 237 | $xh^{(237)}_{15}$ | $xh^{(237)}_{14}$ | ... | $xh^{(237)}_2$ | $xh^{(237)}_1$ | $xh^{(237)}_0$ |
| 238 | $xh^{(238)}_{15}$ | $xh^{(238)}_{14}$ | ... | $xh^{(238)}_2$ | $xh^{(238)}_1$ | $xh^{(238)}_0$ |
| 239~255 | d.c. | d.c. | ... | d.c. | d.c. | d.c. |

FIG. 11B

SHORTENING COMPENSATION PARAMETER TABLE

READING REQUEST ↓  SHORTENING COMPENSATION PARAMETERS ↑

23B

| ADDRESS | CONTENT | | | | | |
|---|---|---|---|---|---|---|
| 0~16 | d.c. | d.c. | · · · | d.c. | d.c. | d.c. |
| 17 | $xh^{(238)}_{15}$ | $xh^{(238)}_{14}$ | · · · | $xh^{(238)}_{2}$ | $xh^{(238)}_{1}$ | $xh^{(238)}_{0}$ |
| 18 | $xh^{(237)}_{15}$ | $xh^{(237)}_{14}$ | · · · | $xh^{(237)}_{2}$ | $xh^{(237)}_{1}$ | $xh^{(237)}_{0}$ |
| ⋮ | ⋮ | ⋮ | · · · | ⋮ | ⋮ | ⋮ |
| 251 | $xh^{(4)}_{15}$ | $xh^{(4)}_{14}$ | · · · | $xh^{(4)}_{2}$ | $xh^{(4)}_{1}$ | $xh^{(4)}_{0}$ |
| 252 | $xh^{(3)}_{15}$ | $xh^{(3)}_{14}$ | · · · | $xh^{(3)}_{2}$ | $xh^{(3)}_{1}$ | $xh^{(3)}_{0}$ |
| 253 | $xh^{(2)}_{15}$ | $xh^{(2)}_{14}$ | · · · | $xh^{(2)}_{2}$ | $xh^{(2)}_{1}$ | $xh^{(2)}_{0}$ |
| 254 | $xh^{(1)}_{15}$ | $xh^{(1)}_{14}$ | · · · | $xh^{(1)}_{2}$ | $xh^{(1)}_{1}$ | $xh^{(1)}_{0}$ |
| 255 | $xh^{(0)}_{15}$ | $xh^{(0)}_{14}$ | · · · | $xh^{(0)}_{2}$ | $xh^{(0)}_{1}$ | $xh^{(0)}_{0}$ |

FIG.17A

SHORTENING COMPENSATION PARAMETER TABLE

READING REQUEST ↓   ↑ SHORTENING COMPENSATION PARAMETERS   33A

| ADDRESS | CONTENT | | | | | |
|---|---|---|---|---|---|---|
| 0 | $xh^{(-1)}_{15}$ | $xh^{(-1)}_{14}$ | ... | $xh^{(-1)}_{2}$ | $xh^{(-1)}_{1}$ | $xh^{(-1)}_{0}$ |
| 1 | $xh^{(0)}_{15}$ | $xh^{(0)}_{14}$ | ... | $xh^{(0)}_{2}$ | $xh^{(0)}_{1}$ | $xh^{(0)}_{0}$ |
| 2 | $xh^{(1)}_{15}$ | $xh^{(1)}_{14}$ | ... | $xh^{(1)}_{2}$ | $xh^{(1)}_{1}$ | $xh^{(1)}_{0}$ |
| 3 | $xh^{(2)}_{15}$ | $xh^{(2)}_{14}$ | ... | $xh^{(2)}_{2}$ | $xh^{(2)}_{1}$ | $xh^{(2)}_{0}$ |
| 4 | $xh^{(3)}_{15}$ | $xh^{(3)}_{14}$ | ... | $xh^{(3)}_{2}$ | $xh^{(3)}_{1}$ | $xh^{(3)}_{0}$ |
| ⋮ | $xh^{(4)}_{15}$ | $xh^{(4)}_{14}$ | ... | $xh^{(4)}_{2}$ | $xh^{(4)}_{1}$ | $xh^{(4)}_{0}$ |
| 237 | ⋮ | ⋮ | ... | ⋮ | ⋮ | ⋮ |
| 238 | $xh^{(237)}_{15}$ | $xh^{(237)}_{14}$ | ... | $xh^{(237)}_{2}$ | $xh^{(237)}_{1}$ | $xh^{(237)}_{0}$ |
| 239 | $xh^{(238)}_{15}$ | $xh^{(238)}_{14}$ | ... | $xh^{(238)}_{2}$ | $xh^{(238)}_{1}$ | $xh^{(238)}_{0}$ |
| 240~255 | d.c. | d.c. | ... | d.c. | d.c. | d.c. |

FIG.17B

SHORTENING COMPENSATION PARAMETER TABLE

READING REQUEST ↓    ↑ SHORTENING COMPENSATION PARAMETERS

33B

| ADDRESS | CONTENT | | | | | |
|---|---|---|---|---|---|---|
| 0~15 | d.c. | d.c. | ... | d.c. | d.c. | d.c. |
| 16 | $xh^{(238)}_{15}$ | $xh^{(238)}_{14}$ | ... | $xh^{(238)}_{2}$ | $xh^{(238)}_{1}$ | $xh^{(238)}_{0}$ |
| 17 | $xh^{(237)}_{15}$ | $xh^{(237)}_{14}$ | ... | $xh^{(237)}_{2}$ | $xh^{(237)}_{1}$ | $xh^{(237)}_{0}$ |
| 18 | ⋮ | ⋮ | ... | ⋮ | ⋮ | ⋮ |
| ⋮ | $xh^{(4)}_{15}$ | $xh^{(4)}_{14}$ | ... | $xh^{(4)}_{2}$ | $xh^{(4)}_{1}$ | $xh^{(4)}_{0}$ |
| 251 | $xh^{(3)}_{15}$ | $xh^{(3)}_{14}$ | ... | $xh^{(3)}_{2}$ | $xh^{(3)}_{1}$ | $xh^{(3)}_{0}$ |
| 252 | $xh^{(2)}_{15}$ | $xh^{(2)}_{14}$ | ... | $xh^{(2)}_{2}$ | $xh^{(2)}_{1}$ | $xh^{(2)}_{0}$ |
| 253 | $xh^{(1)}_{15}$ | $xh^{(1)}_{14}$ | ... | $xh^{(1)}_{2}$ | $xh^{(1)}_{1}$ | $xh^{(1)}_{0}$ |
| 254 | $xh^{(0)}_{15}$ | $xh^{(0)}_{14}$ | ... | $xh^{(0)}_{2}$ | $xh^{(0)}_{1}$ | $xh^{(0)}_{0}$ |
| 255 | $xh^{(-1)}_{15}$ | $xh^{(-1)}_{14}$ | ... | $xh^{(-1)}_{2}$ | $xh^{(-1)}_{1}$ | $xh^{(-1)}_{0}$ |

OPTICAL LINE TERMINAL AND OPTICAL NETWORK TERMINAL

CLAIM OF PRIORITY

The present application claims priority from Japanese patent application serial no. 2006-234108, filed on Aug. 30, 2006, the content of which is hereby incorporated by reference into this application.

BACKGROUND OF THE INVENTION

The present invention relates to an optical line terminal and an optical network terminal in an optical access system for providing communication between a subscriber's home and a central office of a carrier.

Of public communication networks for transferring data such as audio and video, there are used telephone subscriber network, ADSL, and other networks to implement an access network in which users are accommodated in a central office. Recently introduction of an optical access system has been started.

A known example of the optical access system is PON (Passive Optical Network) as a mode of 1 to n connection between the central office side and the subscriber side. The PON provides data communication between an OLT (Optical Line Terminal) located in a central office and plural ONTs (Optical Network Terminals) located in subscribers homes, using a shared bandwidth in such a way that each optical wavelength is assigned for ascending and descending. In the case of signals on the descending side from the OLT to the ONTs, an optical signal is split into signals halfway through in a splitter. The ONT side extracts only a signal addressed to the own terminal. Thus communication is established therebetween. In the case of signals on the ascending side, the OLT notifies the ONTs of transmission time timing. The ONTs transmit signals to the OLT in accordance with the timing. In this way plural ONTs communicate with the OLT by sharing a single wavelength.

Known examples of such an optical access system are B-PON (Broadband PON), A-PON (ATM PON), GE-PON (Giga-bit Ether PON), and G-PON (Gigabit-capable PON). Particularly G-PON attracts attention for the following reasons. That is, G-PON is the fastest with a maximum ascending speed of 1.25 Gbits/s and a maximum descending speed of 2.5 Gbits/s, serving plural protocols by adopting a native GEM (Gigabit-capable Encapsulation Method/G-PON Encapsulation Method) that provides support for ATM, Ethernet, and WDM protocols.

As described above since the splitter exists between the OLT and the ONT, both the descending and ascending signals are attenuated. Thus the application of encoding/decoding technology of forward error correction code (FEC) is being investigated also for the PON. Among block codes having a mathematically consistent system, the most commonly used forward error correction code is a code that is called a systematic code due to its transparency of information. The systematic code partitions a sequential signal series into a certain number of blocks to perform encoding for each block. The systematic code has a feature of only adding check bits to a predetermined space area of a signal, without operating the original signal information. Examples of the block code are Hamming code, BCH code (Bose-Chaudhuri-Hocquenghem code), and Reed-Solomon code, which have been used for long time. Hereinafter encoding and decoding of the forward error correction code is simply referred to as encoding and decoding.

In U.S. Pat. No. 7,024,616 B2, there is described a method for configuring an error correction code, and transmitting equipment. The error correction code has a higher gain while maintaining an original transmission distance when an optical signal transmitted through a single-core fiber is wavelength multiplexed even if the degree of time division multiplexing for the optical signal is approximately doubled, being capable of increasing the repeater spacing of the optical signal by a factor of four, and having a high degree of interconnectivity with the existing transmission network to which an eight-error-correcting Reed-Solomon code defined in ITU-T Recommendation G.975 is introduced.

SUMMARY OF THE INVENTION

The present invention provides an optical line terminal and an optical network terminal, which can process with the same error correction code, even if the FEC size of G-PON descending signals is different between two types of 255 and 120.

The above can be achieved by an optical line terminal including a photoelectric converter, a PON transceiver, and a physical layer, in which the PON transceiver includes an error correction code encoder including a shortening compensation parameter table and a shortening compensation calculator for calculating compensated data by referring to the shortening compensation parameter table. Or it can be achieved by an optical line terminal including a photoelectric converter, a PON transceiver, and a physical layer, in which the PON transceiver includes an error correction code encoder including a shortening compensation calculator for calculating the shortening compensation by selecting an appropriate combination of multiplication circuits from plural combinations of multiplication circuits.

Further the above can be achieved by an optical network terminal including a photoelectric converter, a PON transceiver, and a physical layer, in which the PON transceiver includes an error correction code encoder including a shortening compensation parameter table and a shortening compensation calculator for calculating compensated data by referring to the shortening compensation parameter table. Or it can be achieved by an optical network terminal including a photoelectric converter, a PON transceiver, and a physical layer (PHY), in which the PON transceiver includes an error correction code encoder including a shortening compensation calculator for calculating the shortening compensation by selecting an appropriate combination of multiplication circuits from plural combinations of multiplication circuits.

BRIEF DESCRIPTION OF THE DRAWINGS

FIG. 5 is a block diagram of a PON transceiver block of the ONT;
FIGS. 6A and 6B are block diagrams of a PON receiver and a PON transmitter in the OLT;
FIGS. 7A and 7B are block diagrams of a PON receiver and a PON transmitter in the ONT.

FIG. 8C is a view illustrating the configuration of an FEC code word (parallel 16 bits, part 1);

FIG. 8E is a view illustrating the configuration of an FEC code word (parallel 8 bits, variable word length);

FIG. 9 is a block diagram of an FEC encoder;

FIG. 10 is a block diagram of a shortening compensation calculator of the FEC encoder;

FIG. 11A is a view illustrating a shortening compensation parameter table of the FEC encoder;

FIG. 11B is a view illustrating another shortening compensation parameter table of the FEC encoder;

FIG. 17A is a view illustrating a shortening compensation parameter table of the FEC encoder;

FIG. 17B is a view illustrating another shortening compensation parameter table of the FEC encoder;

DETAILED DESCRIPTION OF THE PREFERRED EMBODIMENTS

Figure 1:
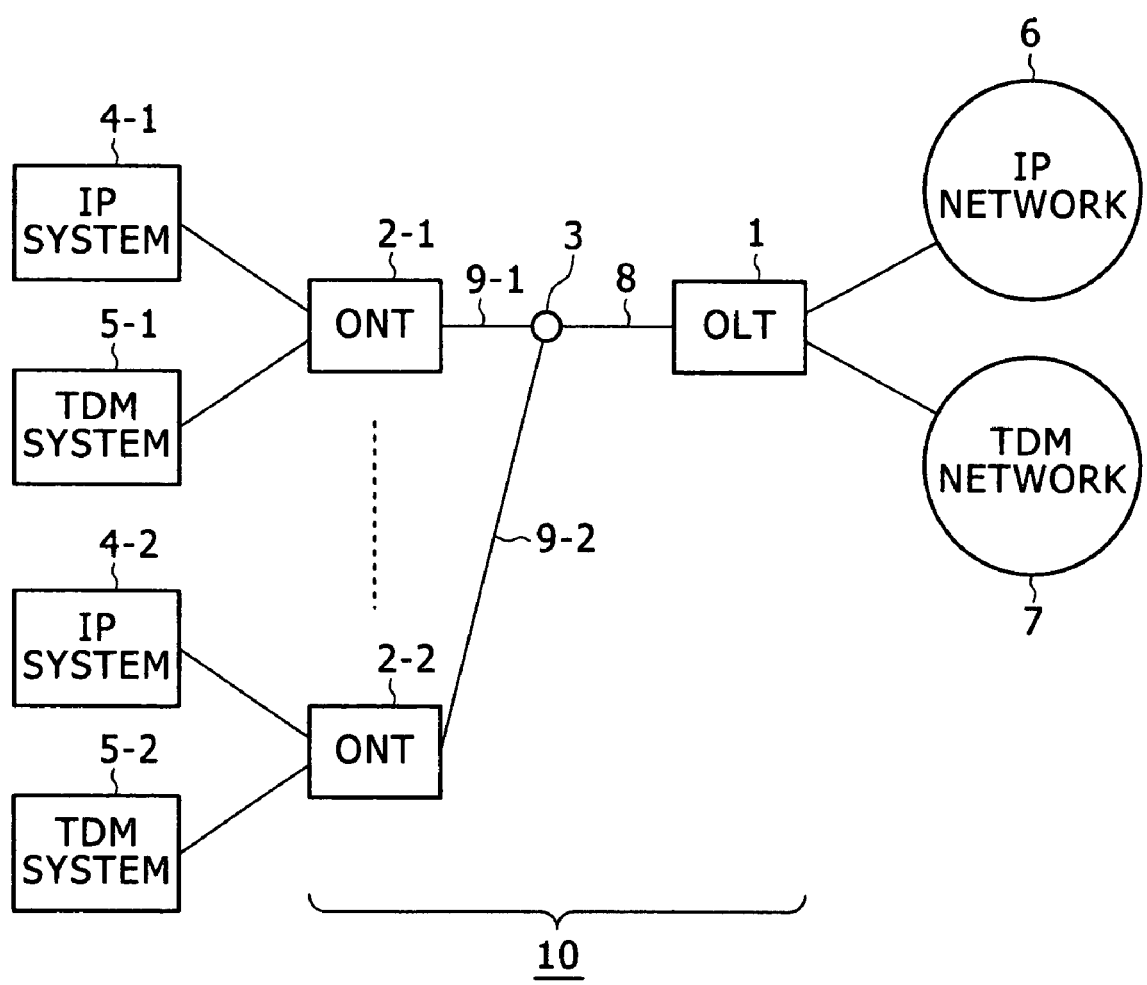
FIG. 1 is a block diagram of an optical access network.

A mode for carrying out the invention will be described below based on preferred embodiments with reference to the accompanying drawings. Incidentally substantially like parts are denoted by like reference numerals and the description will not be repeated.

FIG. 1 is a block diagram of an optical access network. An optical access network 10 includes: an optical line terminal (OLT) 1; optical network terminals (ONTs) 2; a splitter 3; a trunk line fiber 8 between the OLT 1 and the splitter 3; and subscriber fibers 9 between the splitter 3 and the ONTs 2. The ONT 2 is connected to an IP system 4 and a TDM system 5. The OLT 1 is connected to an IP network 6 and a TDM network 7.

A TDM signal from the TDM system 5 is accommodated in the TDM network 7 through the optical access network 10. A signal from the IP system 4 is accommodated in the IP network 7 through the optical access network 10. These signals are referred to as ascending signals.

A TDM signal from the TDM network 7 is accommodated in the TDM system 5 through the optical access network 10. A signal from the IP network 6 is accommodated in the IP system 4 through the optical access network 10. These signals are referred to as descending signals.

Incidentally in the block diagrams of FIG. 2 to FIG. 7 described below, the signal flow directions (ascending, descending) are in accordance with FIG. 1.

Figure 2:
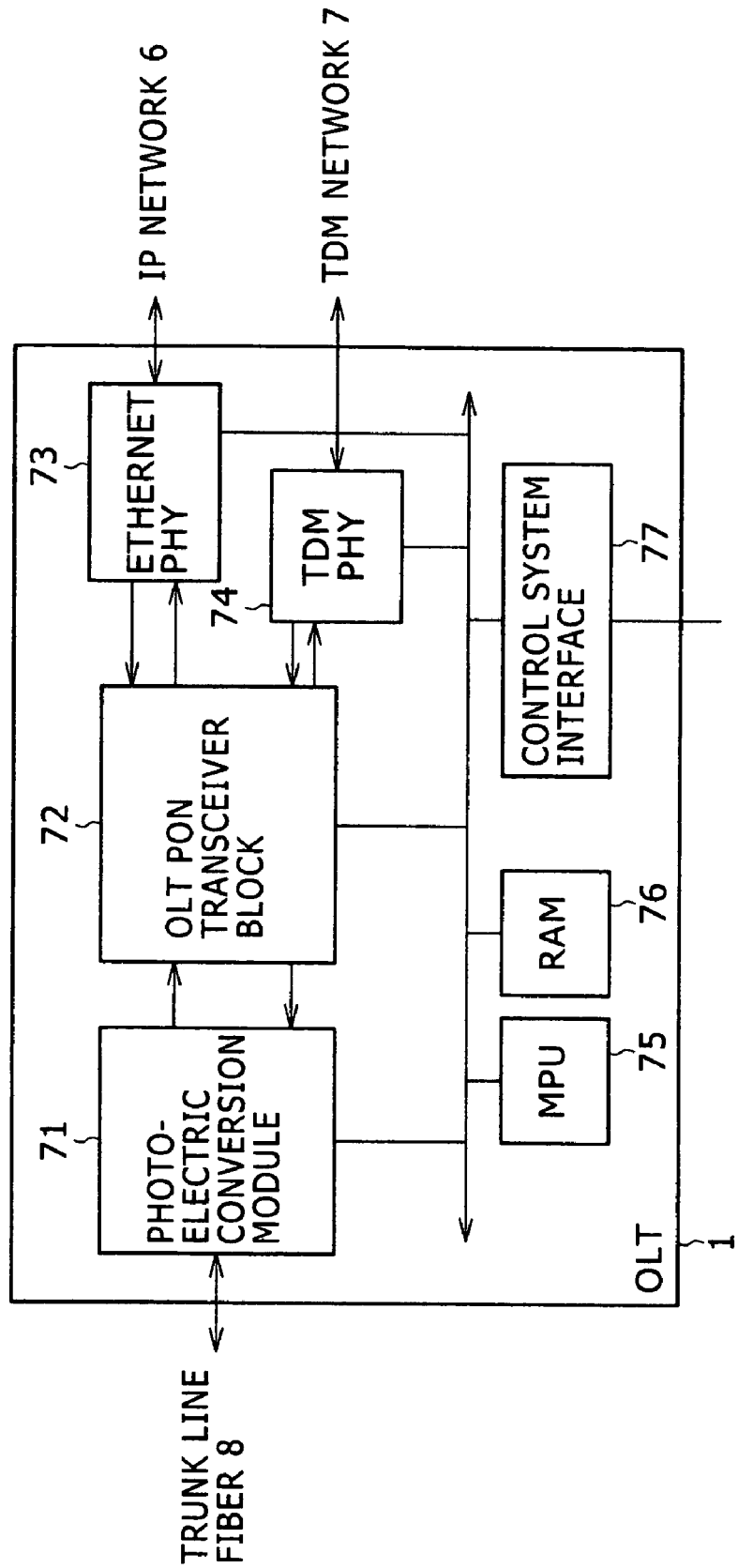
FIG. 2 is a block diagram of an OLT.

FIG. 2 is a block diagram of the OLT. An ascending optical signal from the trunk line fiber 8 is converted into an electrical signal by a photoelectric conversion module 71, and is subjected to GEM termination in an OLT PON transceiver block 72. The converted electrical signal is converted into an Ethernet signal and a TDM signal by the GEM termination. The Ethernet signal is transmitted to the IP network 6 through an Ethernet PHY 73, while the TDM signal is transmitted to the TDM network 7 through a TDM PHY 74.

Descending signals arriving from the IP network 6 and the TDH network 7 are received by the Ethernet PHY 73 and the TDM PHY 74, respectively, and are transmitted to the OLT PON transceiver block 72. The OLT PON transceiver block 72 assembles a GEM frame and then transmits to the trunk line fiber 8 through the photoelectric conversion module 71. An MPU 75 is a microcomputer for controlling the OLT 1, a RAM 76 is a random access memory, and a control system interface 77 is an interface for setting to the OLT 1 from the outside.

Figure 3:
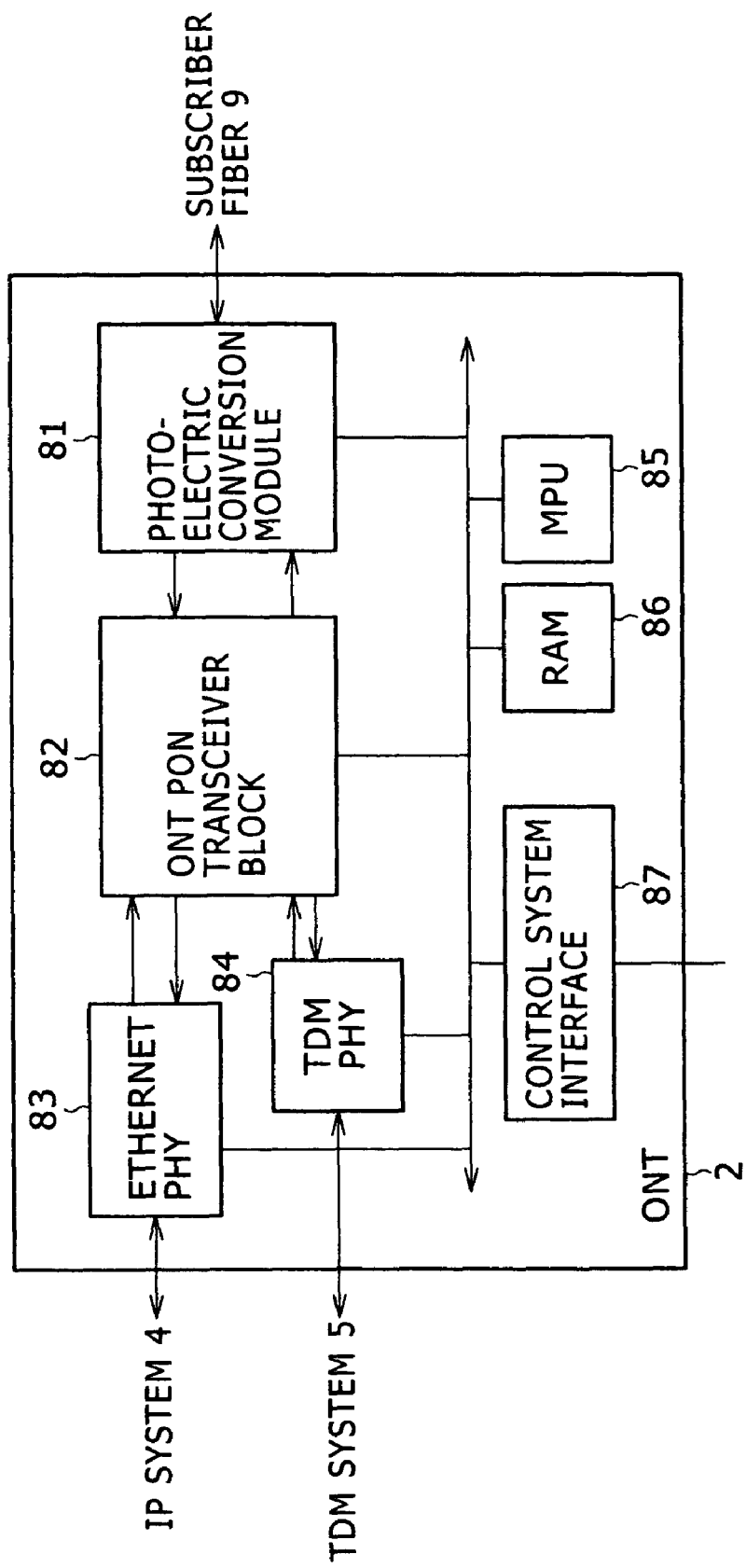
FIG. 3 is a block diagram of an ONT.

FIG. 3 is a block diagram of the ONT. A descending optical signal from the subscriber fiber 9 is converted into an electrical signal by a photoelectric conversion module 81, and is subjected to GEM termination in an ONT PON transceiver block 82. The ONT PON transceiver block 82 converts the converted electrical signal into an Ethernet signal and a TDM signal. The Ethernet signal is transmitted to the IP system 4 through an Ethernet PHY 83. The TDM signal is transmitted to the TDM system 5 through a TDM PHY 84.

Ascending signals from the IP system 4 and TDM system 5 are received by the Ethernet PHY 83 and the TDM PHY 84, respectively, and are transmitted to the ONT PON transceiver block 82. The ONT PON transceiver block 82 assembles a GEM frame and then transmits to the subscriber fiber 9 through the photoelectric conversion module 81. An MPU 85 is a microcomputer for controlling the ONT 2, a RAM 86 is a RANDOM ACCESS MEMORY, and a control system interface 87 is an interface for setting to the ONT 2 from the outside.

Figure 4:
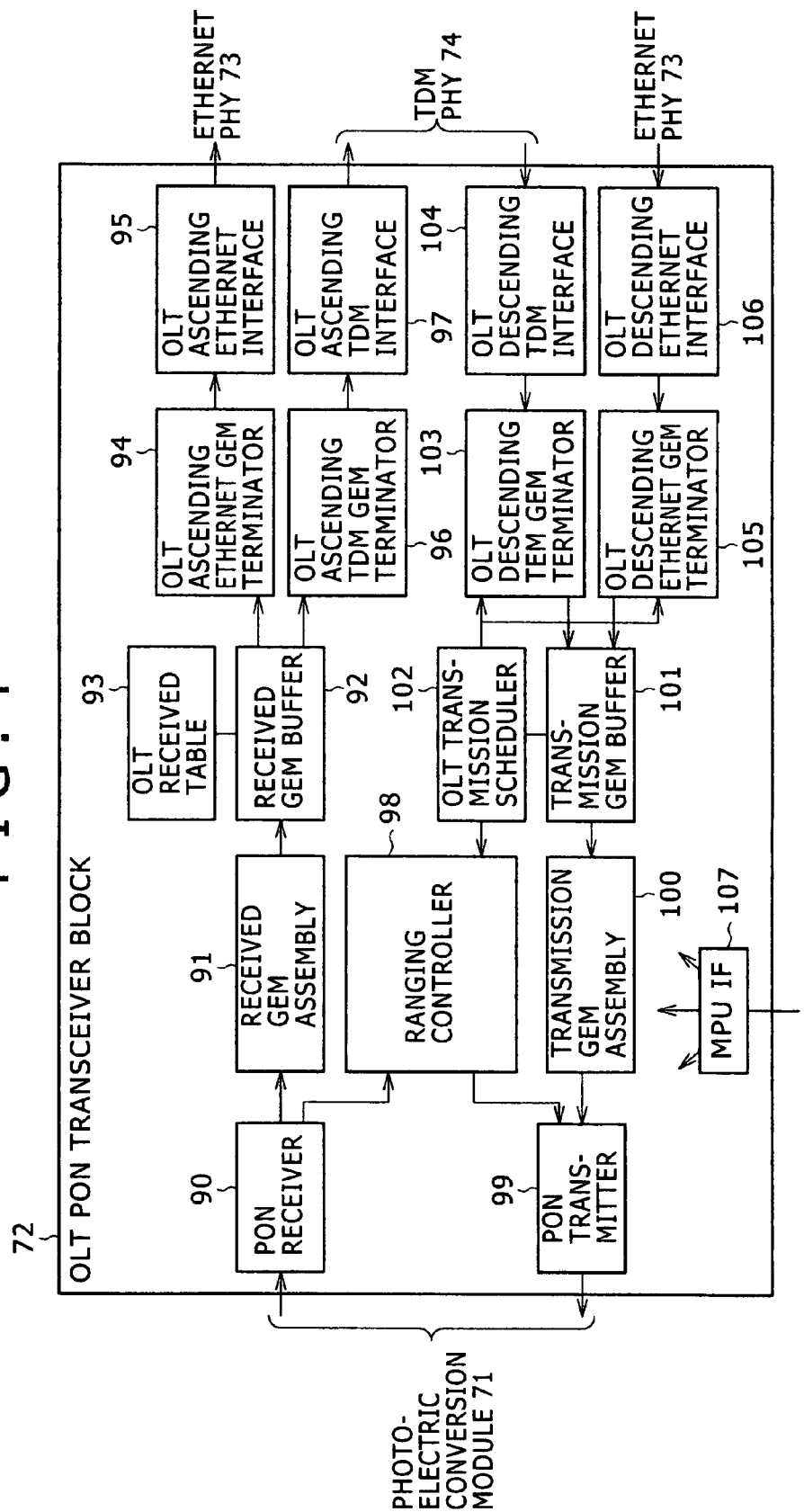
FIG. 4 is a block diagram of a PON transceiver block of the OLT.

FIG. 4 is a block diagram of the PON transceiver block of the OLT. The ascending PON frame signal from the photoelectric conversion module 71 is subjected to a synchronization process and a GEM cutting-out process by a PON receiver 90. Then the cut out payload is transmitted to a received GEM assembly 91. The received GEM assembly 91 assembles the transmitted GEM that is divided into plural short term frames. Then the assembled GEM is stored in a received GEM buffer 92, and is sorted into an OLT ascending Ethernet GEM terminator 94 and an OLT ascending TDM GEM terminator 96, according to the table information of an OLT received table 93.

The OLT ascending Ethernet GEM terminator 94 extracts the Ethernet frame from the GEM frame, and transmits the extracted Ethernet frame to the Ethernet PHY 73 through an OLT ascending Ethernet interface 95. The OLT ascending TDM GEM terminator 96 extracts the TDM signal from the GEM frame, and transmits the extracted TDM signal to the TDM PHY 74 through an OLT ascending TDM interface 97 at a desired timing.

With respect to the descending signals, an OLT descending TDM interface 104 receives the TDM signal from the TDM PHY 74. An OLT descending TDM GEM terminator 103 generates a GEM by buffering the TDM signal. An OLT descending Ethernet interface 106 receives the Ethernet frame from the Ethernet PHY 73. An OLT descending Ethernet GEM terminator 105 generates a GEM. An OLT transmission scheduler 102 controls the OLT descending TDM GEM terminator 103 to periodically transmit the GEM of the TDM signal to a transmission GEM buffer 101. The OLT transmission scheduler 102 also controls the OLT descending Ethernet GEM terminator 105 to transmit the GEM of the Ethernet signal to the transmission GEM buffer 101 at an idle timing. The OLT transmission scheduler 102 controls the transmission GEM buffer 101 to periodically transfer the GEM of the TDM signal and the GEM of the Ethernet signal to a transmission GEM assembly 100. The transmission GEM assembly 100 assembles the GEM for the amount of payload of the PON frame, and transfers the assembled GEM to a PON transmitter 99. The PON transmitter 99 generates a header and then transmits the PON frame.

When performing ranging as a measurement of the distance between the OLT 1 and the ONT 2, a ranging controller 98 transmits a ranging signal from the PON transmitter 99 at a timing permitted by the OLT transmission scheduler 102. The ranging is completed when a response is returned from the ONT 2 to the ranging controller 98 through the PON receiver 90.

Incidentally, an MPU interface 107 intermediates the control of the MPU 75 to each of the control blocks.

FIG. 5 is a block diagram of the PON transceiver block of the ONT. The descending signal from the photoelectric conversion module 81 is received by a PON receiver 127. The PON receiver 127 performs a synchronization process and a GEM cutting-out process. A received GEM assembly 126 assembles the transmitted GEM that is divided into plural short term frames. The assembled GEM is stored in a received GEM buffer 125, and is sorted into an ONT descending Ethernet GEM terminator 121 and an ONT descending TDM GEM terminator 123, according to the table information of an ONT received table 124. The ONT descending Ethernet GEM terminator 121 extracts the Ethernet frame from the GEM. The extracted Ethernet frame is transmitted to the Ethernet PHY 83 through an ONT descending Ethernet interface 120. The ONT descending TDM GEM terminator 123 extracts the TDM signal from the GEM. The extracted TDM signal is transmitted to the TDM PHY 84 through an ONT descending TDM interface 122 at a predetermined timing.

With respect to the ascending signals, an ONT ascending TDM interface 134 receives the TDM signal. An ONT ascending TDM GEM terminator 133 assembles the GEM by buffering the TDM signal. An ONT ascending Ethernet interface 136 receives the Ethernet frame. An ONT ascending Ethernet GEM terminator 135 generates a GEM. An ONT transmission scheduler 131 controls the ONT ascending TDM GEM terminator 133 to periodically transfer the GEM of the TDM signal to a transmission GEM buffer 132. The ONT transmission scheduler 131 also controls the ONT ascending Ethernet GEM terminator 135 to transfer the GEM of the Ethernet signal to the transmission GEM buffer 132 at an idle timing. The ONT transmission scheduler 131 controls the transmission GEM buffer 132 to periodically transfer the GEM of the TDM signal and the GEM of the Ethernet signal to a transmission GEM assembly 130. The transmission GEM assembly 130 assembles the GEM for the amount of payload of the PON frame, and transfers the assembled GEM to a PON transmitter 129. The PON transmitter 129 generates a header and then transmits the PON frame.

Upon request of the ranging, a ranging controller 128 processes a ranging request signal received by the PON receiver 127, and returns a ranging reception signal through the PON transmitter 129.

Incidentally an MPU interface 137 intermediates the control of the MPU 85 to each of the control blocks.

FIGS. 6A and 6B are block diagrams of the PON receiver and the PON transmitter in the OLT. FIGS. 7A and 7B are block diagrams of the PON receiver and the PON transmitter in the ONT. In FIG. 6A, the OLT PON receiver 90 includes: a descrambler 901 for releasing the scramble of the ascending signal; a frame synchronizer 902 for providing a frame synchronization of the descrambled signal; an FEC decoder 903 for separating an information word and an FEC (Forward Error Correction) parity to correct errors of the information word; a PON frame terminator 904; and a cipher decoder 905 for decrypting codes. In FIG. 6B, the OLT PON transmitter 99 includes: a cipher encoder 991 for encripting the descending signal; a PON frame generator 992 for converting the encrypted data into a PON frame; an FEC encoder 993 for adding an FEC parity to the PON frame; a frame synchronization signal insertion part 994 for inserting a frame synchronization signal; and a scrambler 995.

The ONT PON receiver 127 in FIG. 7A has the same configuration as the OLT PON receiver 90 in FIG. 6A, except for the signal flow. Also the ONT PON transmitter 129 in FIG. 7B has the same configuration as the OLT PON transmitter 99 in FIG. 6B, except for the signal flow. Thus their description will be omitted.

Incidentally, when no cipher is used on the ascending side, both the cipher decoder 905 of the OLT PON receiver 90 and the cipher encoder 991 of the ONT PON transmitter 129 are not needed.

Figure 8A:
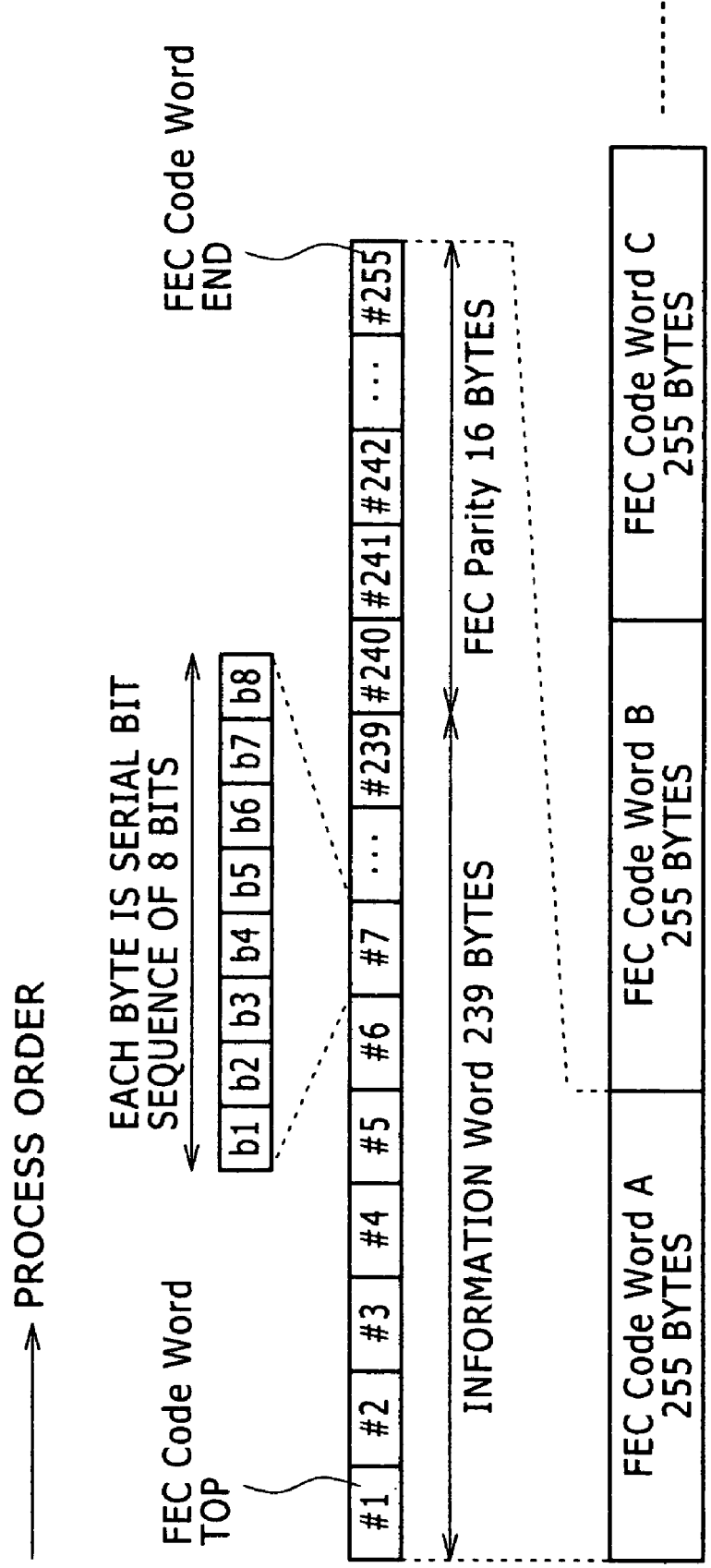
FIG. 8A is a view illustrating the configuration of an FEC code word (serial 8 bits)
Figure 8B:
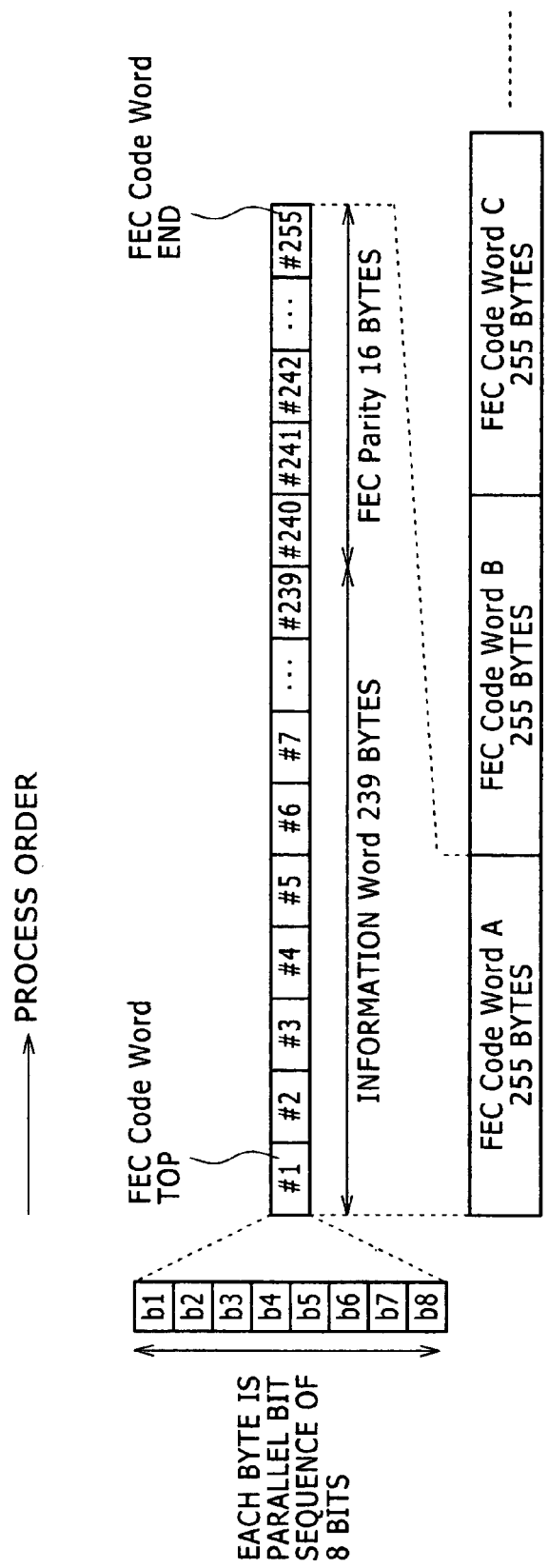
FIG. 8B is a view illustrating the configuration of an FEC code word (parallel 8 bits)
Figure 8D:
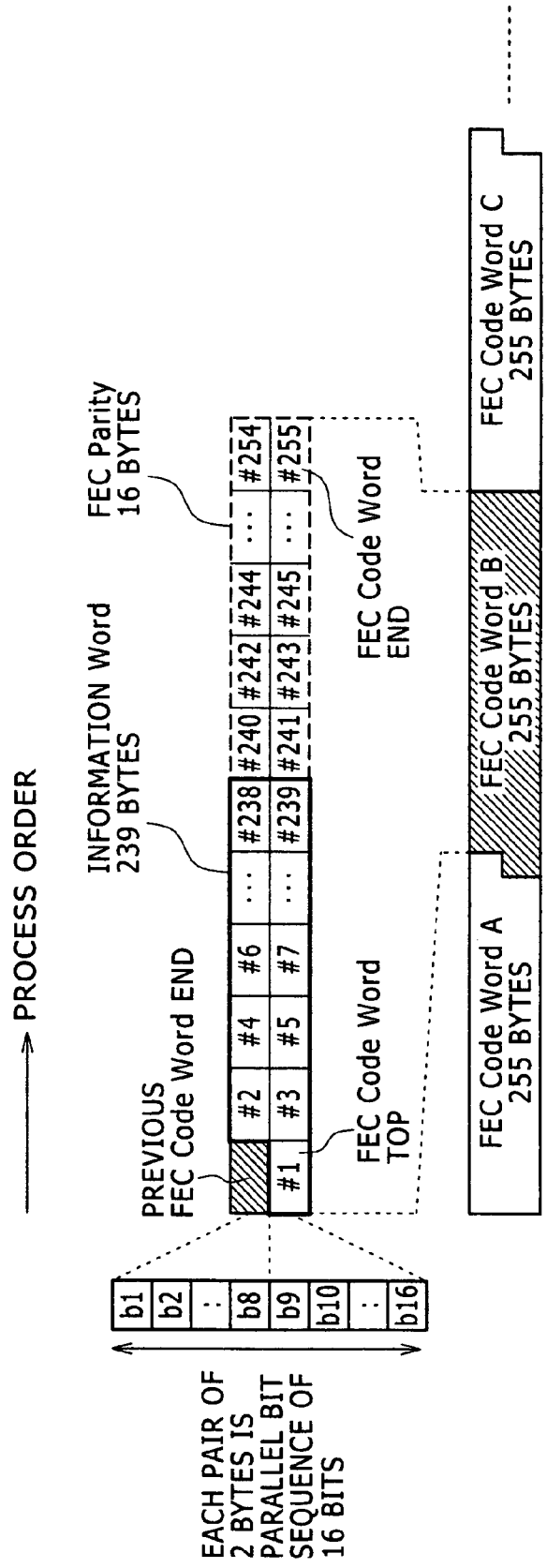
FIG. 8D is a view illustrating the configuration of the FEC code word (parallel 16 bits, part 2)
Figure 8F:
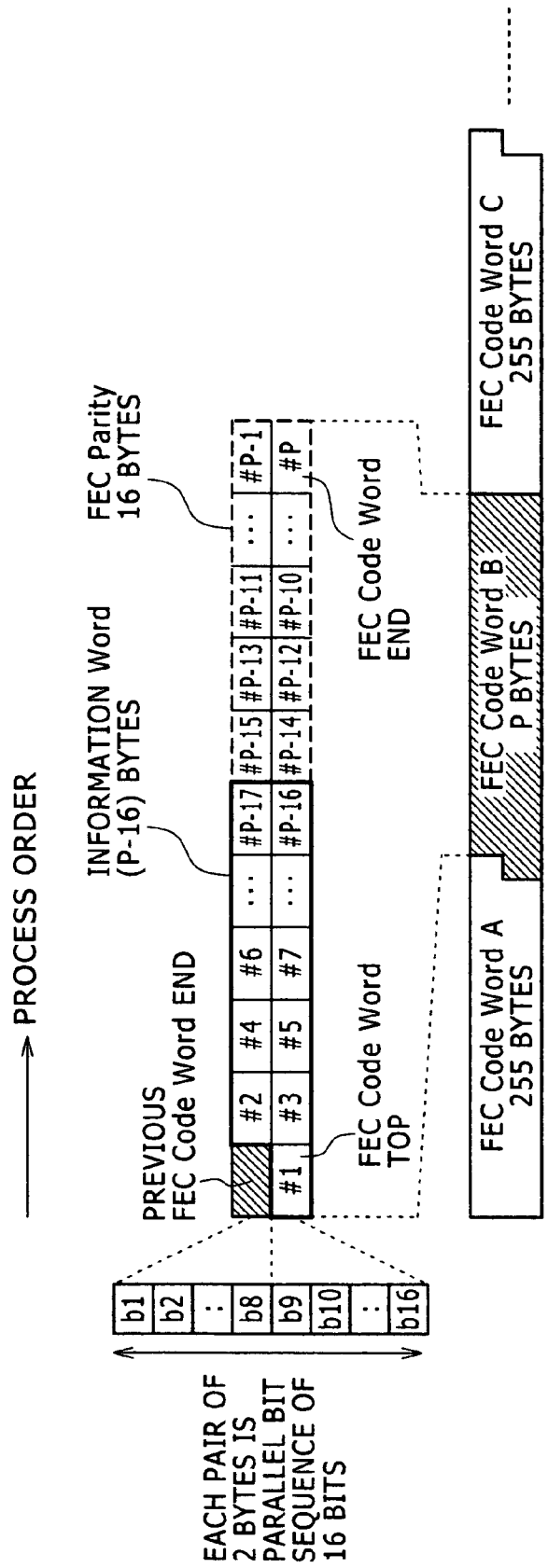
FIG. 8F is a view illustrating the configuration of an FEC code word (parallel 16 bits, variable word length)

FIG. 8A is a view illustrating the configuration of an FEC code word (serial 8 bits). FIG. 8B is a view illustrating the configuration of an FEC code word (parallel 8 bits). FIG. 8C is a view illustrating the configuration of an FEC code word (parallel 16 bits, part 1). FIG. 8D is a view illustrating the configuration of the FEC code word (parallel 16 bits, part 2). FIG. 8E is a view illustrating the configuration of an FEC code word (parallel 8 bits, variable word length). FIG. 8F is a view illustrating the configuration of an FEC code word (parallel 16 bits, variable word length).

In FIG. 8A, the FEC code word has a fixed length of 255 bytes, in which the information word takes 239 bytes from the first byte #1 to #239 and the FEC parity takes 16 bytes from #240 to #255. Further one byte is serial 8 bits.

In FIG. 8B, the FEC code word has a fixed length of 255 bytes, in which the information word takes 239 bytes from the first byte #1 to #239 and the FEC parity takes 16 bytes from #240 to #255. Further one byte is parallel 8 bits. The speed of the FEC code word in FIG. 8B can be reduced to one eighth of the speed of the FEC code word in FIG. 8A.

In FIGS. 8C and 8D, the FEC code word has a fixed length of 255 bytes, in which the information word takes 239 bytes from the first byte #1 to #239 and the FEC parity takes 16 bytes from #240 to #255. Further each pair of 2 bytes is parallel 16 bits. However, since the FEC code word has the fixed length of 255 bytes, it is necessary to have process circuits for the odd numbered FEC code words A, C, and for the even numbered FEC code word B. Incidentally in the following description, unnecessary one byte appearing at the beginning or end of the 16-bit parallel FEC code word will be referred to as "hook". The speed of the FEC code word in FIGS. 8C, 8D can be reduced to one half of the speed of the FEC code word in FIG. 8B.

In FIG. 8E, the FEC code word has a variable length of a range from 17 to 255 bytes, in which the FEC parity takes the last 16 bytes and the information word takes at least the first one byte or at most 239 bytes. Further one byte is parallel 8 bits.

In FIG. 8F, the FEC code word has a variable length of a range from 17 to 255 bytes, in which the FEC parity takes the last 16 bytes and the information word takes at least the first one byte or at most 239 bytes. Further each pair of 2 bytes is parallel 16 bits.

Figure 12:
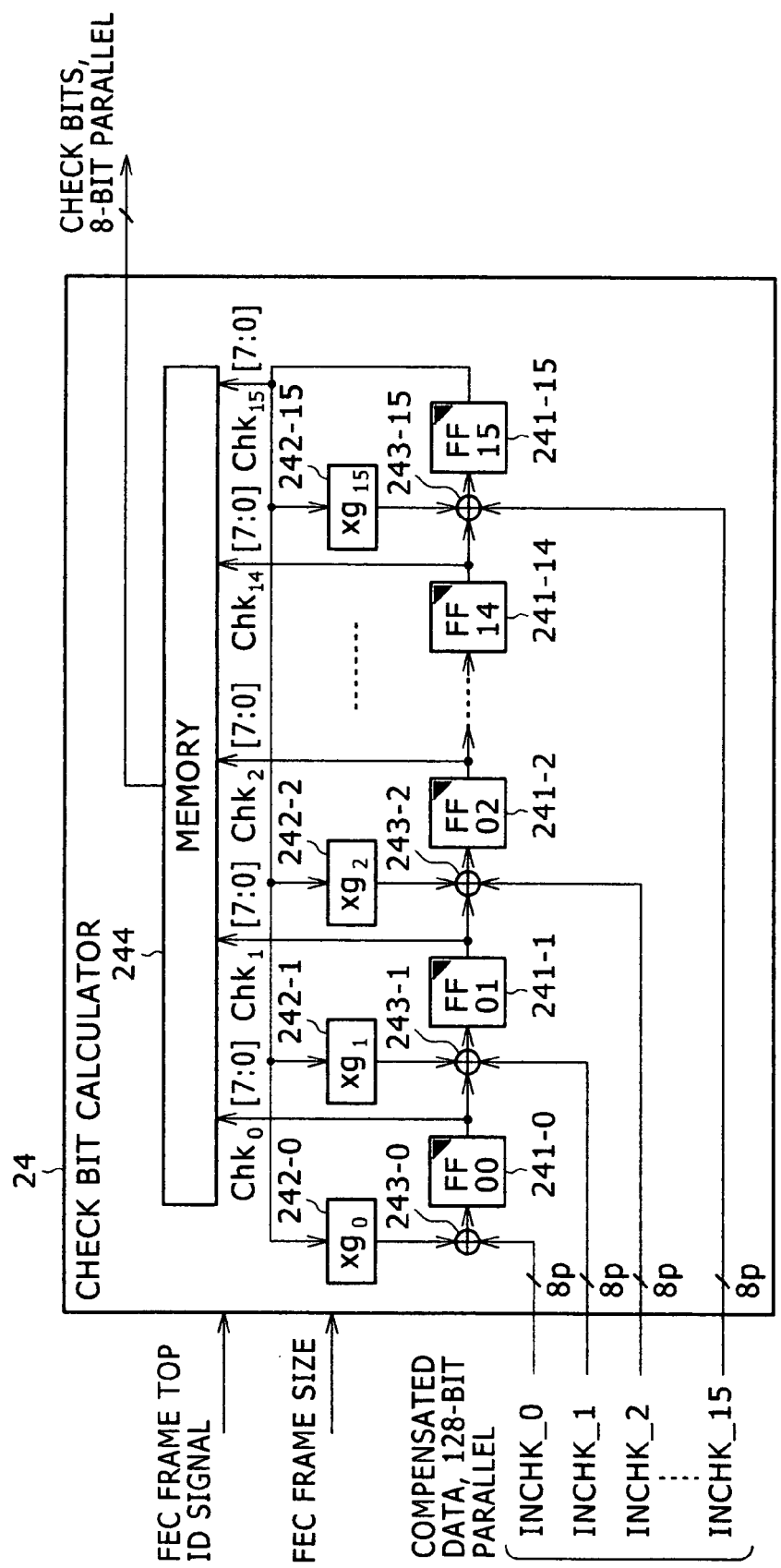
FIG. 12 is a block diagram of a check bit calculator of the FEC encoder.
Figure 13:
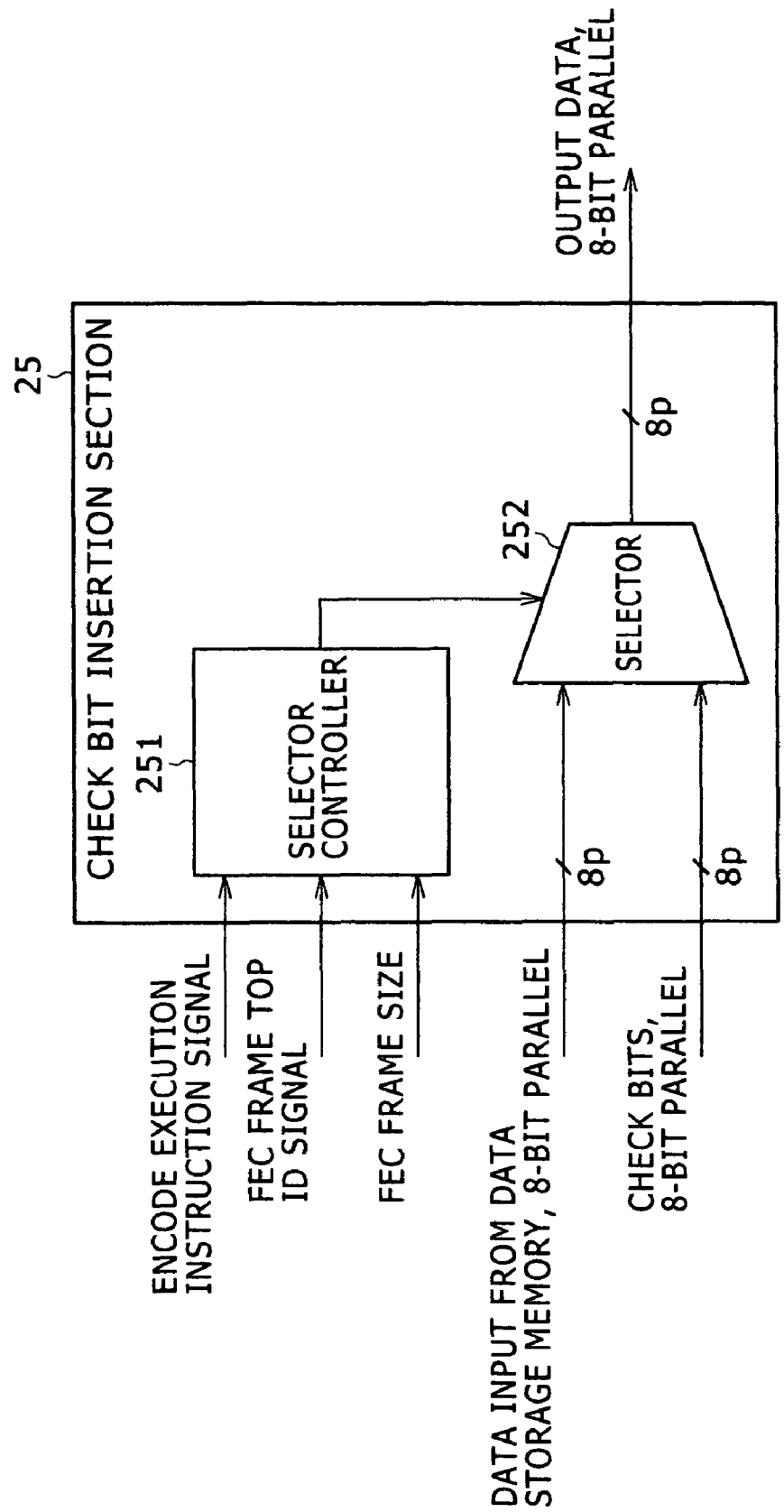
FIG. 13 is a block diagram of a check bit insertion part of the FEC encoder.
Figure 14:
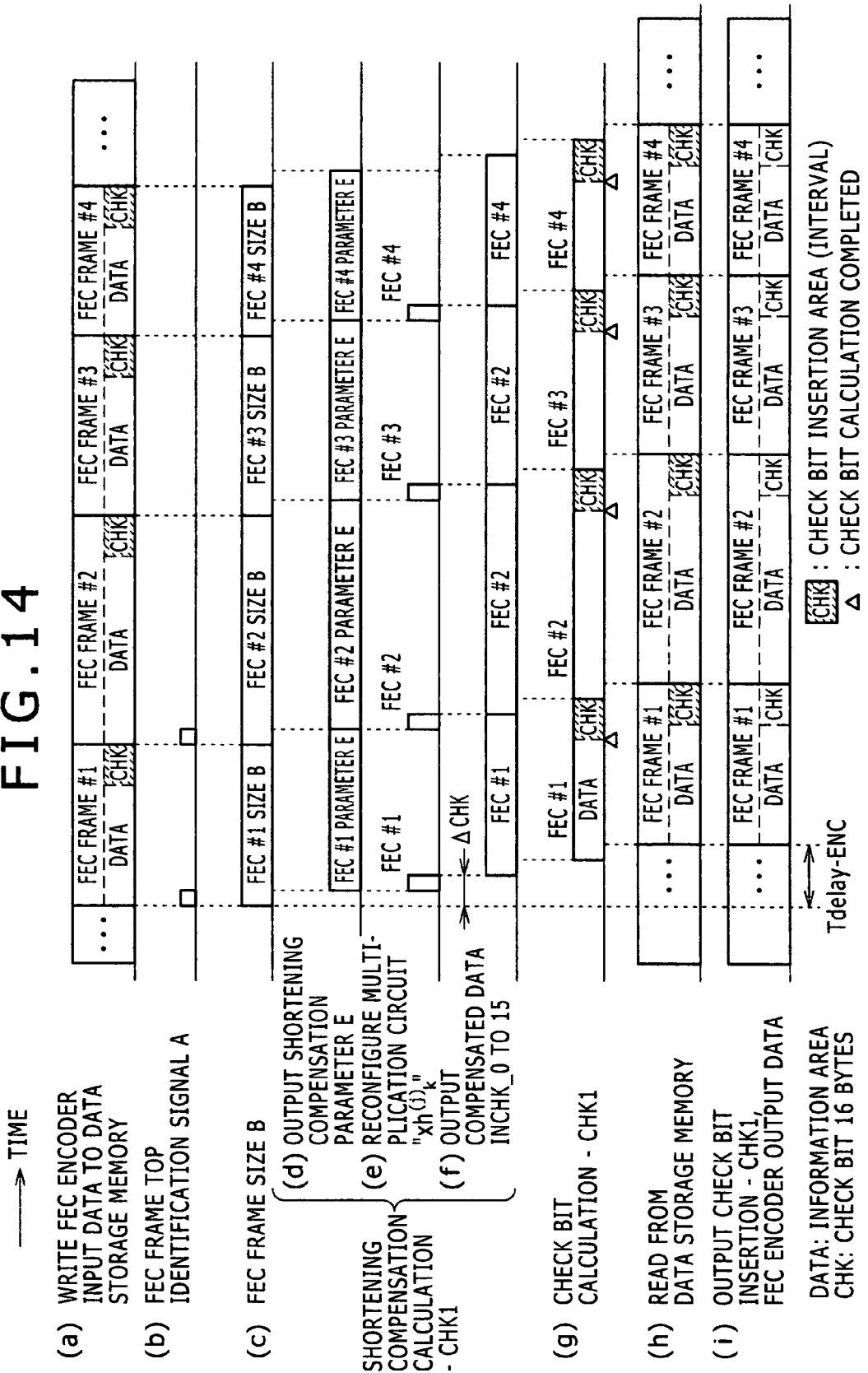
FIG. 14 is a time chart of the process of the FEC encoder.

Referring to FIGS. 9 to 14, a description will be made with respect to an FEC encoder supporting the 8-bit parallel variable length. FIG. 9 is a block diagram of an FEC encoder. FIG. 10 is a block diagram of a shortening compensation calculator of the FEC encoder. FIGS. 11A and 11B are views illustrating shortening compensation parameter tables of the FEC encoder. FIG. 12 is a block diagram of a check bit calculator of the FEC encoder. FIG. 13 is a block diagram of a check bit insertion part of the FEC encoder. FIG. 14 is a time chart of the process of the FEC encoder.

In FIG. 9, an FEC encoder 993A includes a data storage memory 21, a shortening compensation calculator 22, a shortening compensation parameter table 23, a check bit calculator 24, and a check bit insertion part 25. An encode execution instruction signal is input to the check bit insertion part 25. Further, 8-bit parallel input data is input to the data storage memory 21 and the shortening compensation calculator 22. An FEC frame top identification signal and FEC frame size are input to the data storage memory 21, shortening compensation calculator 22, check bit calculator 24, and the check bit insertion part 25. 8-bit parallel output data is output from the check bit insertion part 25 of the FEC encoder 993A. Here, the FEC frame top identification signal is a signal indicating a start timing of the FEC frame on the 8-bit parallel data stream. The term shortening means that the frame size is short relative to the FEC frame size 255.

The data storage memory 21 maintains the input data until the check bit calculation is completed. The shortening compensation calculator 22 calculates the reference address corresponding to the FEC frame size. The shortening compensation calculator 22 obtains shortening compensation parameters by referring to the shortening compensation parameter table 23 with the reference address as a key. The shortening compensation calculator 22 transmits 128-bit parallel compensated data to the check bit calculator 24. The check bit calculator 24 transmits 8-bit parallel check bits to the check bit insertion part 25 based on the 128-bit parallel compensated data. The check bit insertion part 25 inserts the check bits into the input data maintained by the data storage memory 21, and outputs 8-bit parallel output data.

In FIG. 10, the shortening compensation calculator 22 includes a delay memory 221, a reference address calculator 222, and 16 multiplication circuits 223. The delay memory 221 maintains the 8-bit parallel data for a period of ΔCHK until shortening compensation parameters, xh(j)i (where i is from 0 to 15)of the multiplication circuits 223 are set. Here j is the degree of shortening. The reference address calculator 222 calculates the address of the shortening compensation parameter table corresponding to the FEC frame size, and requests the shortening compensation parameters recoded in the relevant address. The multiplication circuits 223 are once reset by the FEC frame top identification signal, and then perform parameter setting based on the received shortening compensation parameters. After the parameter setting, the multiplication circuits 223 receive the 8-bit parallel data from the delay memory 221, and perform a multiplication operation to output parallel compensated data of 8 bits each or 128 bits in total.

In FIG. 11A, a shortening compensation parameter table 23A is a table in which each address is provided with 16-byte parameters. Here the address represents the number of shortened and omitted bytes. Upon receiving a reading request with the specified address from the shortening compensation calculator 22, the shortening compensation parameter table 23A transmits the shortening compensation parameters as the content of the relevant address back to the shortening compensation calculator 22. Since the maximum value of the information word is 239 bytes as described in FIG. 8, the values are assigned to the addresses from 0 to 238, but d.c. (don't care) for the addresses from 239 to 255. Further the address values of the shortening compensation parameter table 23 are set in advance by calculating the parameters for the multiplication circuits xh(j)15, . . . , xh(j)1, and xh(j)0.

Incidentally since the G-PON descending FEC frame size is 255 and 120, the shortening compensation parameter table 23A may have 2 pairs of addresses of 0 and 135, instead of 239 pairs.

In FIG. 11B, a shortening compensation parameter table 23B is a table in which each address is provided with 16-byte parameters. Here the address represents the shortened frame size. FIG. 11B is the same as FIG. 11A only except for the definition of the address, so that the description will be omitted.

The shortening compensation parameter h(j)k(−1≦j≦238), which was described with reference to FIGS. 11A and 11B, is obtained from Equations 1 and 2:

$$h^{(j)}(Z)=[Z^{j+16}] \bmod G(Z)=h^{(j)}{}_{15} \cdot Z^{15}+h^{(j)}{}_{14} \cdot Z^{14}+\ldots +h^{(j)}{}_1 \cdot Z+h^{(j)}{}_0 \quad \text{[Equation 1]}$$

where, $$G(Z)=Z^{16}+g_{15} \cdot Z^{15}+g_{14} \cdot Z^{14}+\ldots+g_1 \cdot Z+g_0 \quad \text{[Equation 2]}$$

in particular, $$h^{(0)}{}_k=g_k \text{ (for } 0\leq k\leq 15\text{) } h^{(-1)}{}_{15}=1, h^{(-1)}{}_k=0 \text{ (for } 0\leq k\leq 14\text{)} \quad \text{[Equation 3]}$$

In Equations 1 and 2, "·" and "+" are multiplication and addition on Galois Field (2), respectively.

Further, G(Z) of Equation 2 is a generator polynomial, which is defined in the ITU-T recommendation. However there is no need to limit it to this.

Further j=0 simply means 16 carry input, j=−1 simply means 15 carry input.

In FIG. 12, the check bit calculator 24 includes 16 flip flops 241, 16 fixed multiplication circuits 242, 16 addition circuits 243, and a memory 244. The addition circuit is an exclusive logical sum (EOR). Incidentally all the lines in the figure are 8-bit parallel signal lines.

For each segment of the FEC frame, the flip flops 241 and the memory 244 are cleared and initialized to "0" by the FEC frame top identification signal. In the first cycle, the compensated data INCHK_i (where i is from 0 to 15) is input to an addition circuit 243-i to take the exclusive logical sum between the outputs of a flip flop 241-(i−1) and a fixed multiplication circuit 242-i. Here an addition circuit 243-0 has two inputs. The inputs of the fixed multiplication circuits 242 are the output of a flip flop 241-15. In the second cycle, the output of the addition circuit 243-i is taken into the flip flop 241-i, while the compensated data INCHK_i is input to the addition circuit 243-i. This is repeated the number of cycles for the FEC frame size. Next, the outputs of the flip flops 241 are taken into the memory 244. The memory 244 outputs in the order of Chk15, Chk14, . . . , Chk 1, and Chk 0. The output timing of the check bits is calculated with the FEC frame size and the EFC frame top signal. A start signal may be given by the check bit insertion part 25.

In FIG. 13, the check bit insertion part 25 includes a selector controller 251 and a selector 252. The encode execution instruction signal, FEC frame top identification signal, and FEC frame size are all input to the selector controller 251 to control the selector 252. The selector 252 has inputs of the 8-bit parallel signal which is the data input from the data storage memory 21 and of the 8-bit parallel signal which is the check bits from the check bit calculator 24. Then the selector 252 outputs one of the inputs under the control of the selector controller 251.

When the encode execution instruction signal specifies execution of FEC, the check bit insertion part 25 selects the check bit at the timing of the check bit position in the FEC frame. The check bit insertion part 25 selects the data input side at the timing of the position other than the check bit position in the FEC frame.

When the encode execution instruction signal specifies non-execution of FEC, the check bit insertion part 25 always selects the data input side.

In FIG. 14, (a) represents the input data to the FEC encoder, (b) represents the EFC frame top identification signal, (c) represents the frame size data, (d) represents the shortening compensation parameter, (e) represents the multiplication circuit reconfiguration, (f) represents the compensated data, (g) represents the check bit calculation result, (h) represents the reading from the data storage memory, and (i) represents the check bit insertion result.

At the same time of the start of the input data to the FEC encoder, the FEC frame top identification signal rises and then the output of the shortening compensation parameter rises. After completion of the reconfiguration of the multiplication circuit, the compensated data is output. The period of time from the rise of the FEC frame top identification signal to the rise of the compensated data is represented by ΔCHK.

The FEC encoder output data is completed by inserting the check bits into the check bit area after completion of the check bit calculation, while reading the data from the data storage memory.

Figure 15:
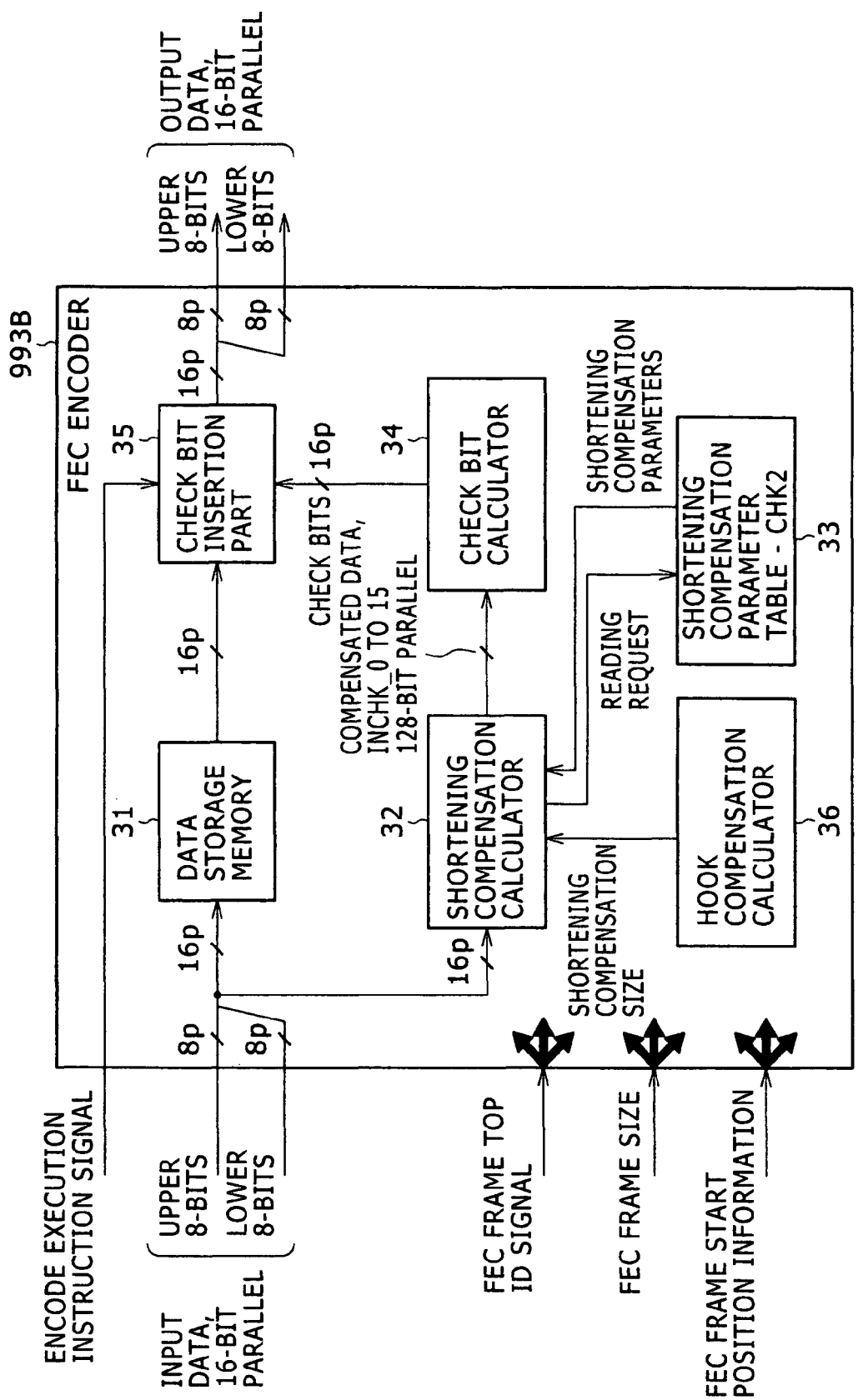
FIG. 15 is a block diagram of another FEC encoder.
Figure 16:
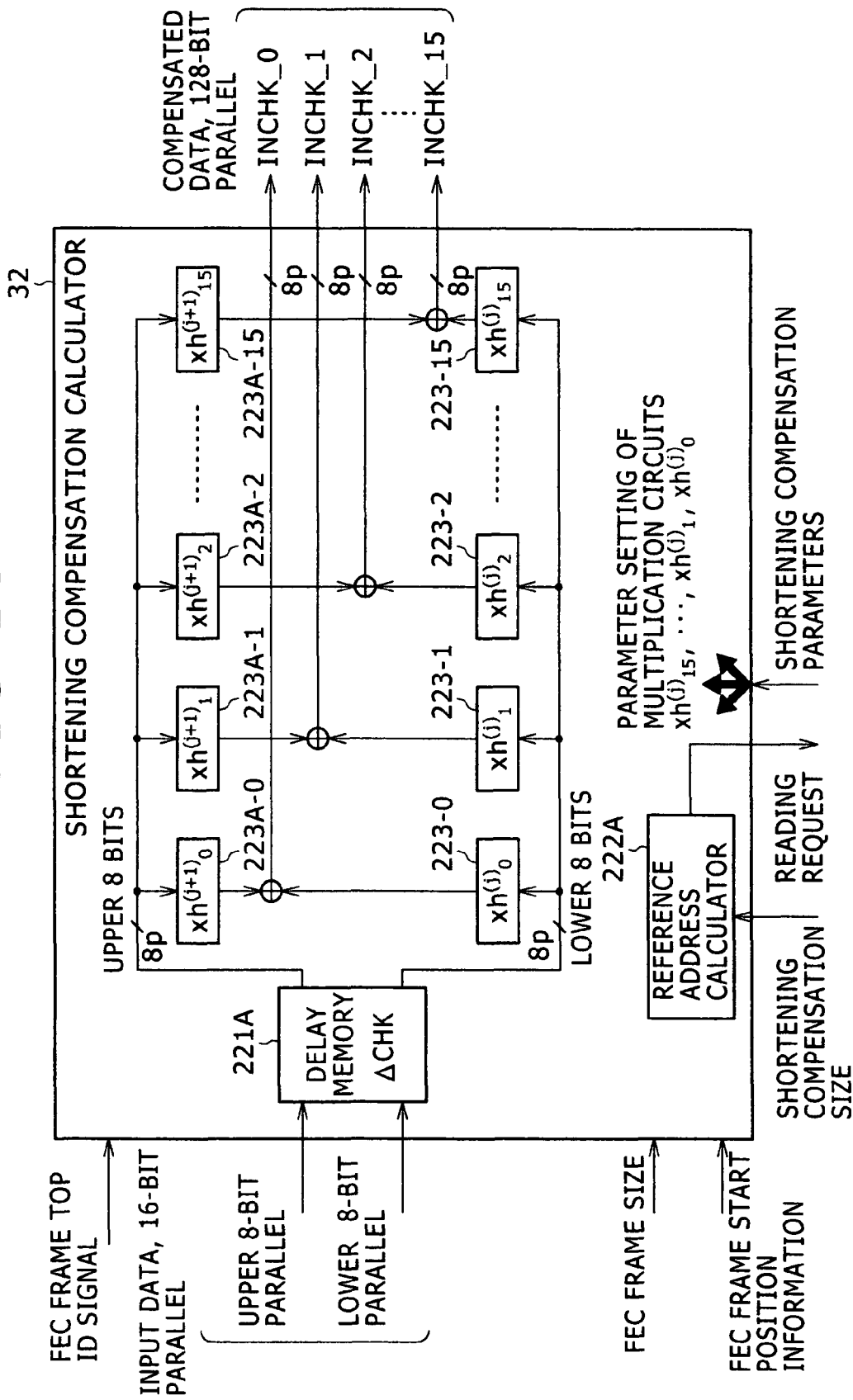
FIG. 16 is a block diagram of a shortening compensation calculator of the FEC encoder.
Figure 18:
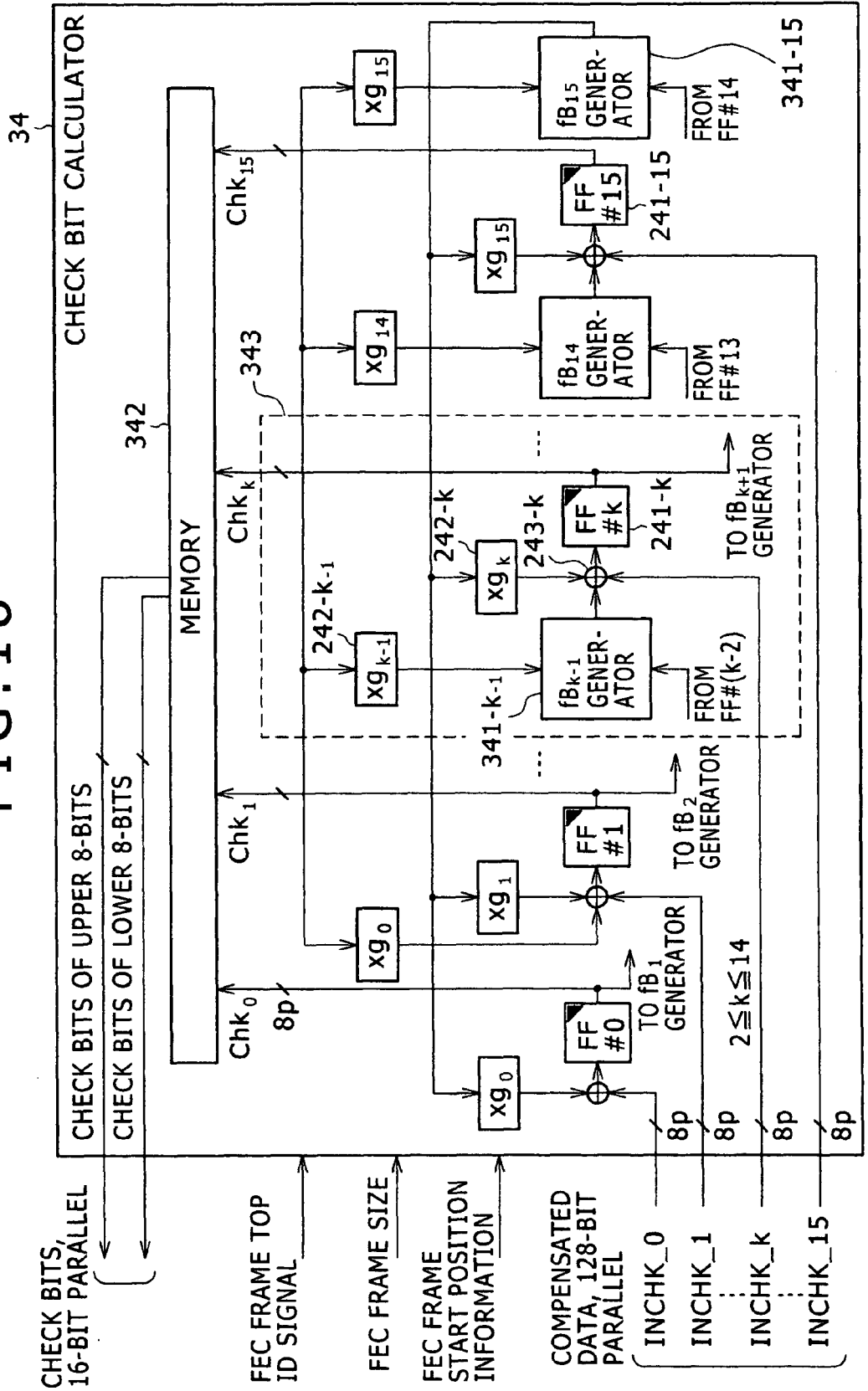
FIG. 18 is a block diagram of a check bit calculator of the FEC encoder.
Figure 19:
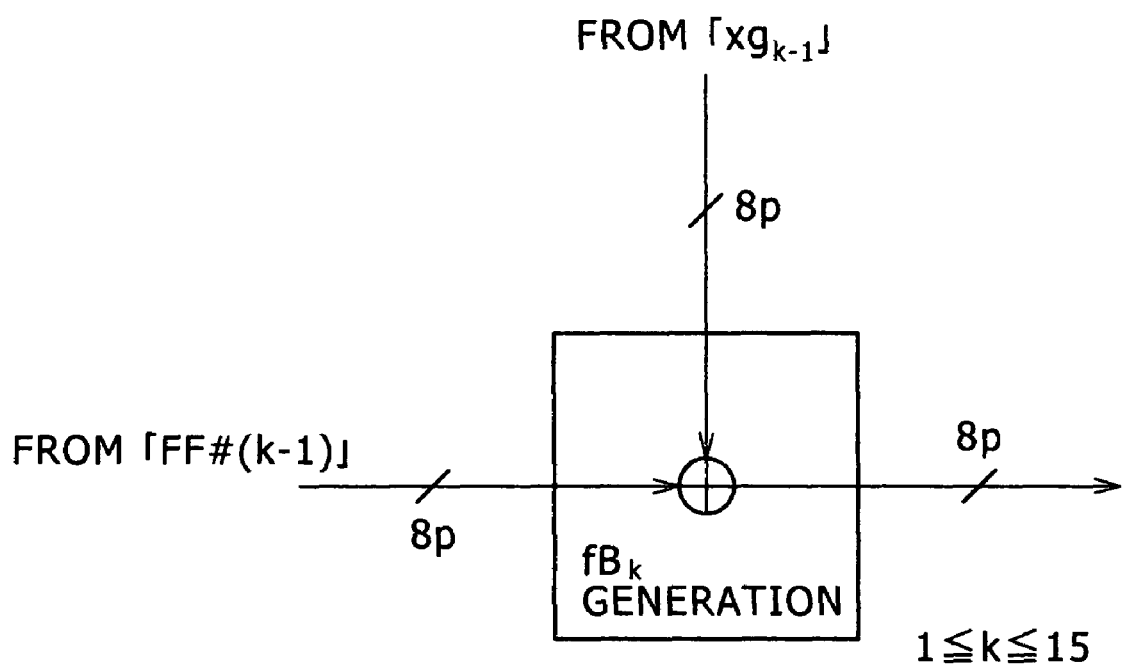
FIG. 19 is a view illustrating fBk generation of the check bit calculator of the FEC encoder.
Figure 20:
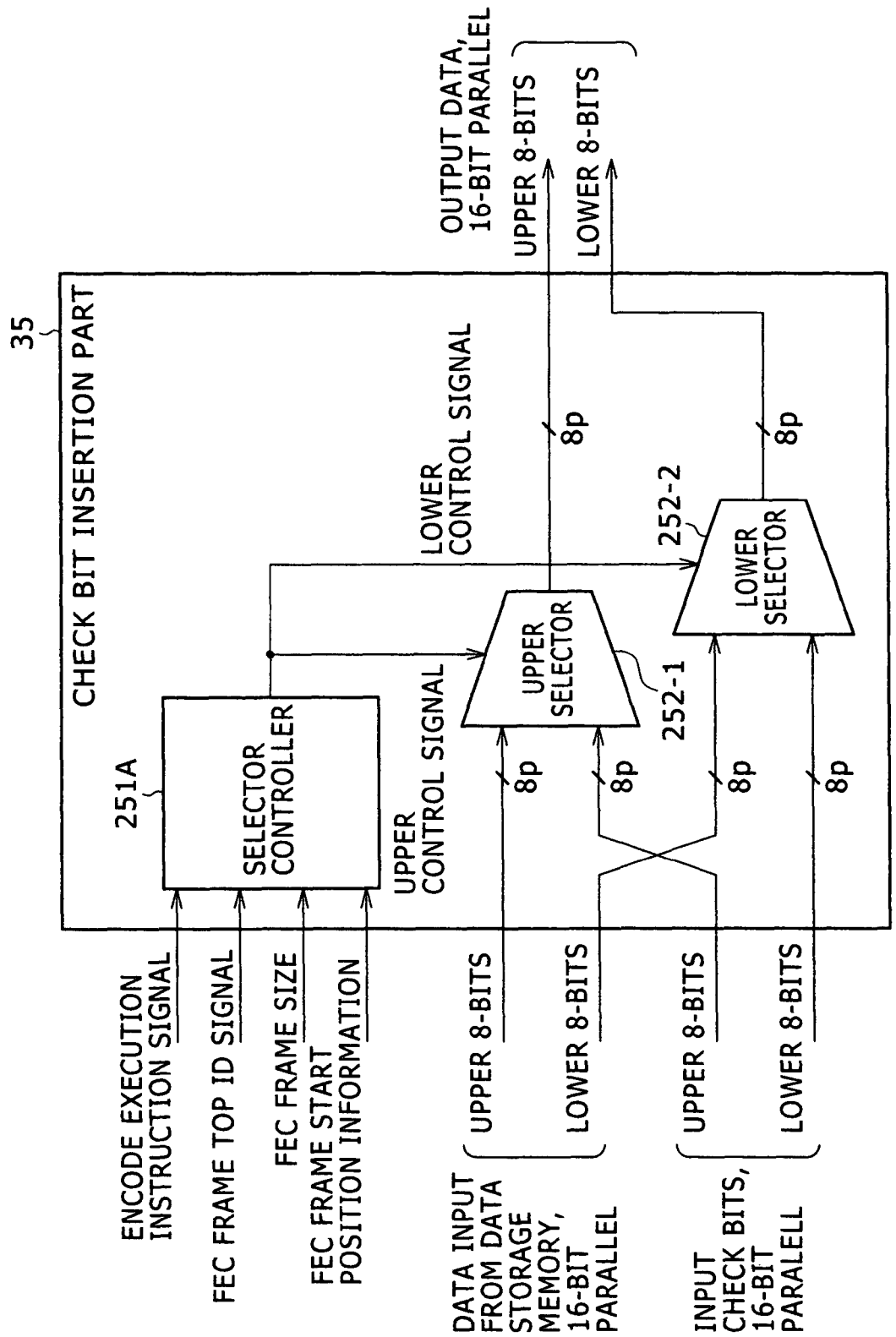
FIG. 20 is a block diagram of a check bit insertion part of the FEC encoder.
Figure 21:
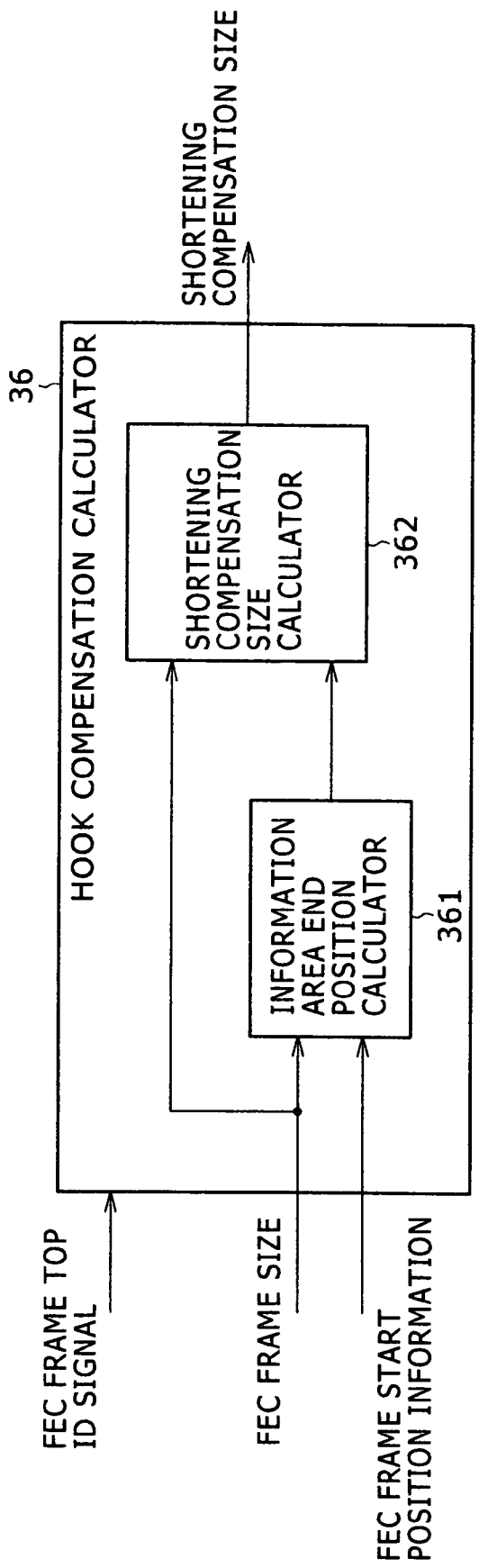
FIG. 21 is a block diagram of a hook compensation calculator of the FEC encoder.
Figure 22:
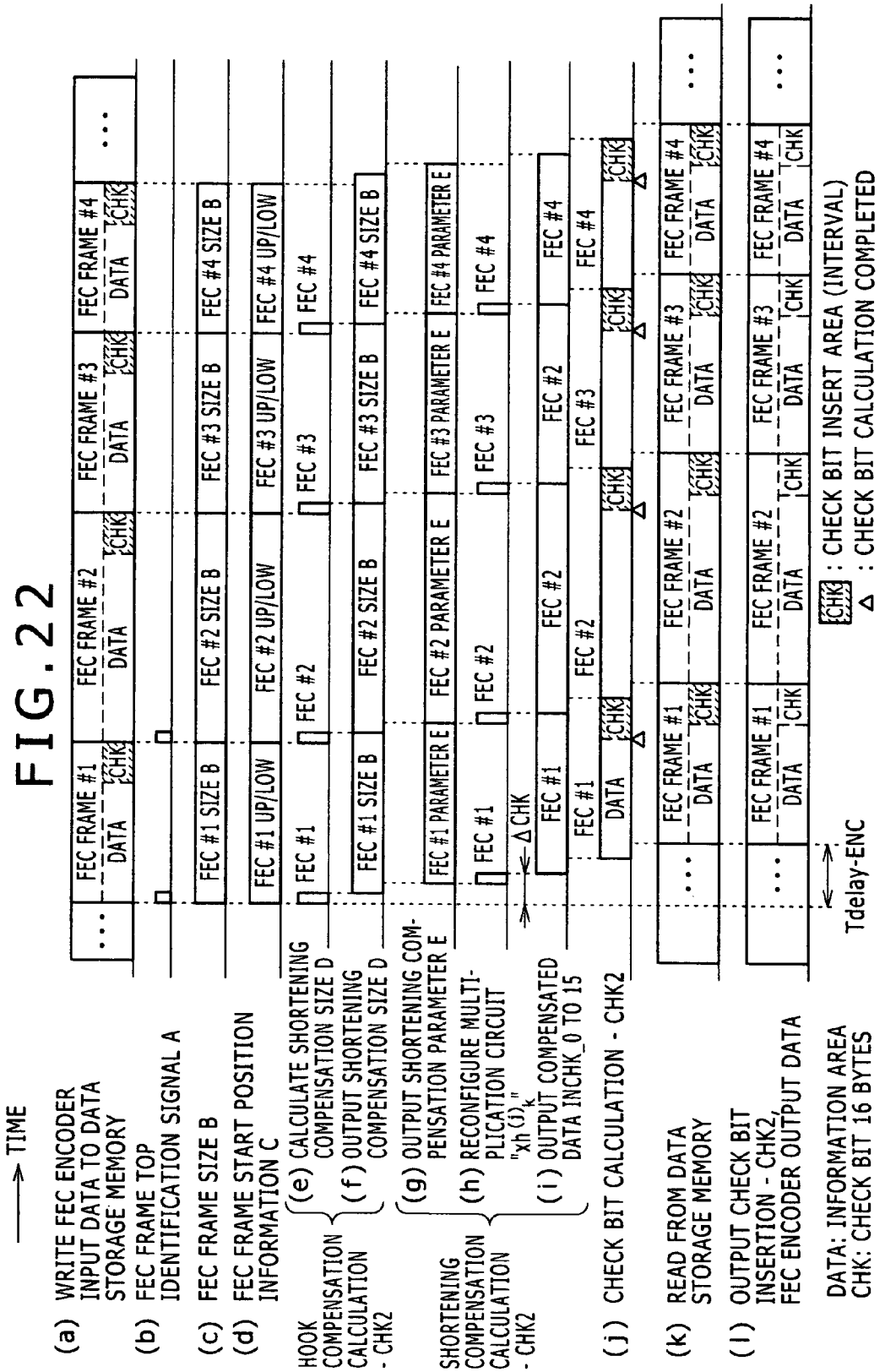
FIG. 22 is a time chart of the process of the FEC encoder.

Next, referring to FIGS. 15 to 22, a description will be made with respect to an EFC encoder supporting the 16-bit parallel variable length. Here FIG. 15 is a block diagram of an FEC encoder. FIG. 16 is a block diagram of a shortening compensation calculator of the EFC encoder. FIG. 17A is a view illustrating a shortening compensation parameter table of the FEC encoder. FIG. 17B is a view illustrating another shortening compensation parameter table of the FEC encoder. FIG. 18 is a block diagram of a check bit calculator of the. FEC encoder. FIG. 19 is a view illustrating fBk generation of the check bit calculator of the FEC encoder. FIG. 20 is a block diagram of a check bit insertion part of the FEC encoder. FIG. 21 is a block diagram of a hook compensation calculator of the FEC encoder. FIG. 22 is a time chart of the process of the FEC encoder.

In FIG. 15, an FEC encoder 993B includes a data storage memory 31, a shortening compensation calculator 32, a shortening compensation parameter table 33, a check bit calculator 34, a check bit insertion part 35, and a hook compensation calculator 36. An encode execution instruction signal is input to the check bit insertion part 35. Further, 16-bit parallel input data is input to the data storage memory 31 and the shortening compensation calculator 32. The FEC frame top identification signal, FEC frame size, and FEC frame start position information are input to the data storage memory 31, shortening compensation calculator 32, check bit calculator 34, check bit insertion part 35, and hook compensation calculator 36. 16-bit parallel output data is output from the check bit insertion part 35 of the FEC encoder 993B. Here the FEC frame top identification signal is a signal indicating a start timing of the FEC frame on the 16-bit parallel data stream. The FEC frame size is the shortened FEC frame size. The FEC frame start position information indicates from which side of the 16-bit parallel data stream, upper 8 bits or lower 8 bits, the FEC frame starts in the FEC frame start timing indicated by the FEC frame top identification signal. The FEC frame start position information may also be information indicating the FEC frame end position. The term shortening means that the frame size is short relative to the FEC frame size 255.

The data storage memory 31 maintains the input data until the check bit calculation is completed. The hook compensation calculator 36 transmits the shortening compensation size to the shortening compensation calculator 32 based on the FEC frame position information. The shortening compensation calculator 32 calculates the reference address corresponding to the shortening compensation size and the FEC frame size. The shortening compensation calculator 32 obtains shortening compensation parameters by referring to the shortening compensation parameter table 33 with the reference address as a key. The shortening compensation calculator 32 transmits 128-bit parallel compensated data to the check bit calculator 34. The check bit calculator 34 transmits 16-bit parallel check bits to the check bit insertion part 35, based on the 128-bit parallel compensated data. The check bit insertion part 35 inserts the check bits into the input data maintained by the data storage memory 31, and then outputs 16-bit parallel output data.

In order to determine the circuit constant relative to the FEC frame to be calculated, the shortening compensation calculator 32 receives the shortening size corresponding to the FEC frame from the hook compensation calculator 36, calculates the address of the table corresponding to the shortening size, and reads the content of the address from the shortening compensation parameter table 33. Based on this content, the shortening compensation calculator 32 operates the circuit constant therein to perform a calculation in advance that is equivalent to the result obtained due to the shortening relative to the input data of the FEC frame, and passes to the check bit calculator 35. The check bit calculator 35 handles the frame size only as far as the start and end of the calculation, without the need for calculation in which shortening is taken into consideration.

In FIG. 16, the shortening compensation calculator 32 includes a delay memory 221A, a reference address calculator 222A, and 32 multiplication circuits 223. The delay memory 221A maintains the 16-bit parallel data for the period of ΔCHK until shortening compensation parameters xh(j)ixh(j+1)i (where i is from 0 to 15) of the multiplication circuits 223 are set. Here j is the degree of shortening. The reference address calculator 222A calculates the address of the shortening compensation parameter table corresponding to the shortening compensation size and FEC frame size, and requests the shortening compensation parameters recorded in the relevant address. The multiplication circuits 223 are once reset by the FEC frame top identification signal, and then perform parameter setting based on the received shortening compensation parameters. After the parameter setting, the multiplication circuits 223 receive upper 8-bit or lower 8-bit parallel data from the delay memory 221A to perform a multiplication operation, respectively. Based on the operation result, the exclusive logical sum for each bit of the upper 8 bits and lower 8 bits is calculated. Thus parallel compensated data of 128 (8 bits×16) bits in total is output.

In FIG. 17A, the shortening compensation parameter table 33A is a table in which each address is provided with 16-byte parameters. Here the address represents the number of shortened and omitted bytes plus one, except for address 0. Upon receiving a reading request with the specified address from the shortening compensation calculator 32, the shortening compensation parameter table 33A transmits the shortening compensation parameters as the content of the relevant address back to the shortening compensation calculator 32. The values are assigned to the addresses from 0 to 239 but d.c. (don't care) for the addresses from 240 to 255. Further the address values of the shortening compensation parameter table 33 are set in advance by calculating the parameters for the multiplication circuits xh(j)15, . . . , xh(j)1, and xh(j)0.

Incidentally since the FEC frame size of the G-PON descending signal is 255 and 120, the shortening compensation parameter table 33A may have 6 pairs of addresses 0, 1, 2 and 135, 136, 137. When the method of shortening the FEC code is top aligned that removes all zeros from the top, there may be sufficient to have 3 pairs of the addresses 0, 1, 2.

In FIG. 17B, the shortening compensation parameter table 33B is a table in which each address is provided with 16-byte parameters. Here the address represents the shortened frame size minus one, except for address 255. FIG. 17B is the same as FIG. 17A only except for the definition of the address, so that the description will be omitted.

In FIG. 18, the check bit calculator 34 includes 16 flip flops 241, 32 fixed multiplication circuits 242, 16 addition circuits 243, a memory 342, and 15 fB generators 341. The FEC frame top identification signal, FEC frame size signal, FEC frame start position information, and compensated data are all input to the check bit calculator 34 to output 16-bit parallel check bits. The addition circuit 243 calculates the exclusive logical sum (EOR). Incidentally all the lines in the figure are 8-bit parallel signal lines.

The basic operation is the same as in FIG. 12 and the description will be omitted. In FIG. 18, a portion surrounded by a dotted line is a check bit calculation unit 343-k. The check bit calculation unit 343-k includes: an addition circuit 243-k having inputs of 8-bit parallel compensated data INCHK_k, the output of a fixed multiplication circuit 242-k, and the output of an fBK-1 generator 341-(k−1); a flip flop 241-k for temporality storing the output of the addition circuit 243-k; the fixed multiplication circuit 242-k; the fBk-1 generator 341-(k−1); and a fixed multiplication circuit 242-(k−1) having an input of the output of a flip flop 241-15. A second input of the fBk-1 generator 341-(k−1) is supplied from the former stage of a flip flop 241-(k−2). The output of the flip flop 241-k is supplied to the later stage of an fBk-1 generator 341-(k+1).

Each of the calculations is repeated the number of cycles for the FEC frame size. Next, the outputs of the flip flops 241 are taken into the memory 342. The memory 342 outputs a 16-bit parallel signal of upper 8 bits and lower 8 bits, in the order of Chk15, Chk14, . . . , Chk1, and Chk0. The output timing of the check bits is calculated from the FEC frame size and the FEC frame top signal. A start signal may be given by the check bit insertion part 25.

In FIG. 19, the fBk generator 341-k is an exclusive logical sum for each bit.

In FIG. 20, the check bit insertion part 35 includes a selector controller 251A and two selectors 252. The encode execution instruction signal, FEC frame top identification signal, FEC frame size, and FEC frame start position information are all input to the selector controller 251A to control the selectors 252. An upper selector 252-1 has inputs of the upper 8-bit parallel signal which is the data input from the data storage memory 31 and the upper 8-bit parallel signal which is the check bits from the check bit calculator 34. Then the upper selector 252-1 outputs one of the inputs under the control of the selector controller 251A. Similarly, a lower selector 252-2 has inputs of the lower 8-bit parallel signal which is the data input from the data storage memory 31 and the lower 8-bit parallel signal which is the check bits from the check bit calculator 34. Then the lower selector 252-2 outputs one of the inputs under the control of the selector controller 251A.

When the encode execution instruction signal specifies execution of FEC, the check bit insertion part 35 selects the check bit at the timing of the check bit position in the FEC frame. The check bit insertion part 35 selects the data input side at the timing of the position other than the check bit position in the FEC frame.

Further when the encode execution instruction signal specifies non-execution of FEC, the check bit insertion part 35 always selects the data input side.

In FIG. 21, the hook compensation calculator 36 includes an information area end position calculator 361 and a shortening size calculator 362. The information area end position calculator 361 generates information area end position information from the FEC frame size and the FEC frame start position information, and passes the generated information to the shortening size calculator 362. The shortening size calculator 362 calculates the shortening compensation size from the information area end position information and the FEC frame size.

The shortening size calculator defines a value "J", which is calculated from the FEC frame size, as the shortening compensation size for the FEC frame in which the end of the information area is on the lower 8-bit side. As for the FEC frame in which the end of the information area is on the upper 8-bit side, the shortening size calculator obtains a value by subtracting "1" from the value "J" calculated from the FEC frame size B, and defines the obtained value as a shortening compensation size D. Here J is the number of bytes omitted due to the shortening.

The information area end position calculator 361 calculates whether the end of the information area is on the upper 8-bit side or on the lower 8-bit side, and then outputs as the information area end position information.

In FIG. 22, (a) represents the input data to the FEC encoder, (b) represents the FEC frame top identification signal, (c) represents the frame size data, (d) represents the FEC frame start position information, (e) represents the shortening compensation size calculation, (f) represents the shortening compensation size output, (g) represents the shortening compensation parameter, (h) represents the multiplication circuit reconfiguration, (i) represents the compensated data, (j) represents the check bit calculation result, (k) represents the reading from the data storage memory, and (l) represents the check bit insertion result.

At the same time of the start of the input data to the FEC encoder, the FEC frame top identification signal rises and the output of the shortening compensation parameter rises. After completion of the reconfiguration of the multiplication circuit, the compensated data is output. The period of time from the rise of the FEC frame top identification signal to the rise of the compensated data is represented by ΔCHK.

The FEC encoder output data is completed by inserting the check bit into the check bit area after completion of the check bit calculation, while reading the data from the data storage memory.

Figure 23:
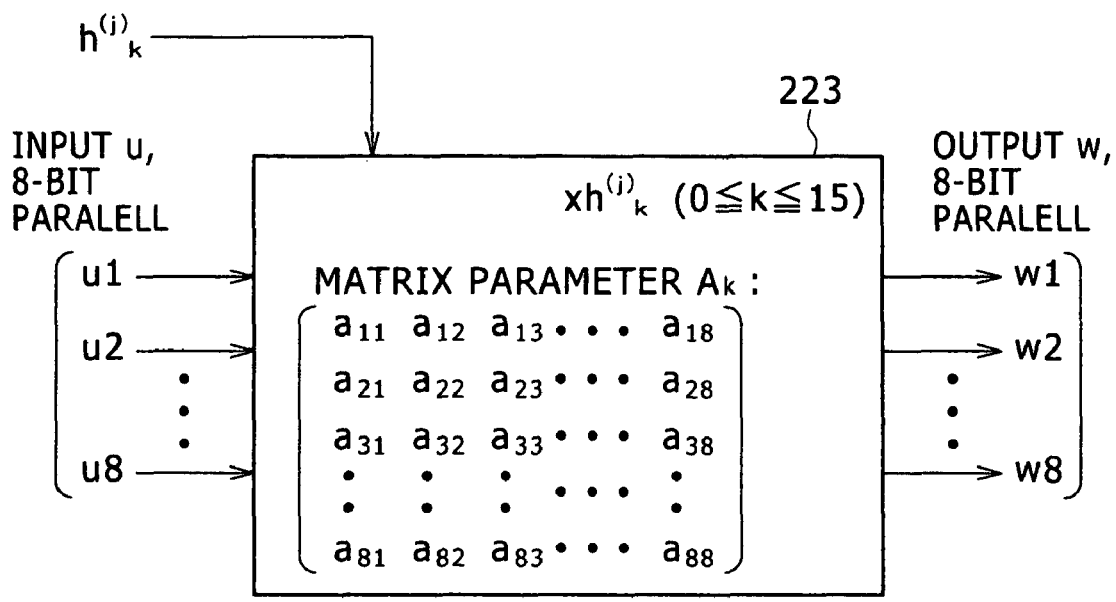
FIG. 23 is a view illustrating a parameter variable multiplication circuit of the FEC encoder.

In FIG. 23, the parameter variable multiplication circuit 223 (xh(j)k) has a matrix parameter Ak defined by h(j)k given from the outside, and converts an 8-bit parallel input u into an 8-bit parallel output w. Each element of the matrix parameter Ak is 0 or 1, which is uniquely determined by the input h(j)k. The function h(j)k is an element of Galois Field (256), based on which the eighth line of the matrix parameter Ak (a81 a82 a83 a84 a85 a86 a87 a88) is expressed in 8-bit binary number.

The first to seventh lines of the matrix parameter Ak are obtained by calculating Equation 4 with p=m+1 by substituting from 7 for m (1≦m≦7). In Equation 4, "+" is the exclusive logical sum.

$$a_{m1}=a_{p2}, a_{m2}=a_{p3}, a_{m3}=a_{p4}$$

$$a_{m4}=a_{p5}+a_{p1}$$

$$a_{m5}=a_{p6}+a_{p1}$$

$$a_{m6}=a_{p7}+a_{p1}$$

$$a_{m7}=a_{p8}, a_{m8}=a_{p1} \quad \text{[Equation 4]}$$

In Equation 5, w is obtained from u and the elements of the matrix parameter Ak. Incidentally "·" is the logical product, and "+" is the exclusive logical sum.

$$w1 = a_{11} \cdot u1 + a_{12} \cdot u2 + a_{13} \cdot u3 + \ldots + a_{18} \cdot u8 \quad \text{[Equation 5]}$$
$$w2 = a_{21} \cdot u1 + a_{22} \cdot u2 + a_{23} \cdot u3 + \ldots + a_{28} \cdot u8$$
$$w3 = a_{31} \cdot u1 + a_{32} \cdot u2 + a_{33} \cdot u3 + \ldots + a_{38} \cdot u8$$
$$\vdots$$
$$w8 = a_{81} \cdot u1 + a_{82} \cdot u2 + a_{83} \cdot u3 + \ldots + a_{88} \cdot u8$$

Figure 24:
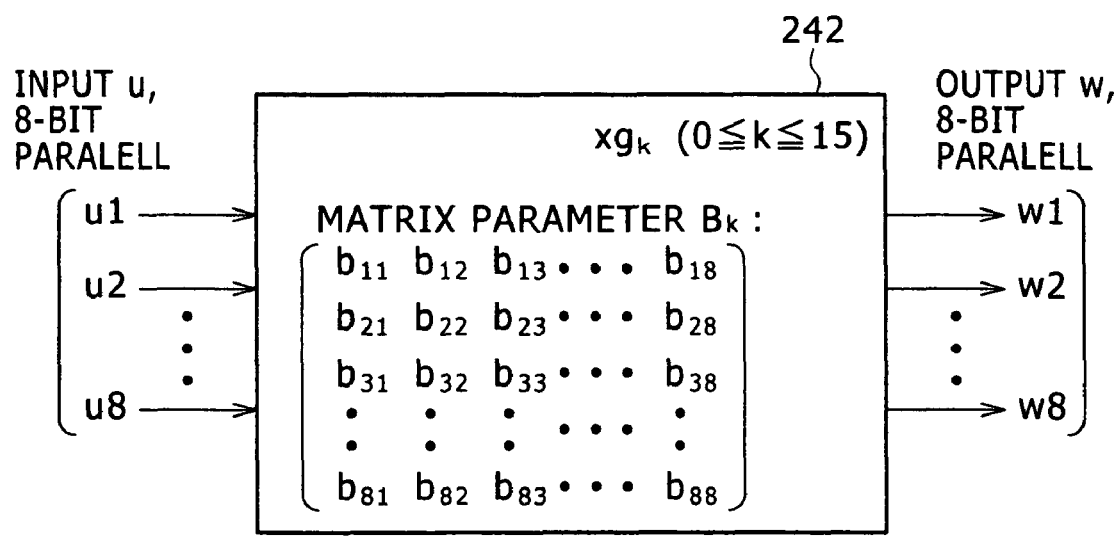
FIG. 24 is a view illustrating a fixed variable multiplication circuit of the FEC encoder.

In FIG. 24, the fixed multiplication circuit 242 (xgk) uses its matrix parameter Bk to convert an 8-bit parallel input u into an 8-bit parallel output w. Each element of the matrix parameter Bk is 0 or 1. Here gk is an original source of Galois Field (256), based on which the eighth line of the matrix parameter Bk (b81 b82 b83 b84 b85 b86 b87 b88) is expressed in 8-bit binary number. The function gk is a coefficient of the FEC generator polynomial.

The first to seventh lines of the matrix parameter Bk are obtained by calculating Equation 5 with p=m+1 by substituting from 7 for m (1≦m≦7). In Equation 5, "+" is the exclusive logical sum.

$$b_{m1}=b_{p2}, b_{m2}=b_{p3}, b_{m3}=b_{p4}$$

$$b_{m4}=b_{p5}+b_{p1}$$

$$b_{m5}=b_{p6}+b_{p1}$$

$$b_{m6}=b_{p7}+b_{p1}$$

$$b_{m7}=b_{p8}, b_{m8}=b_{p1} \quad \text{[Equation 6]}$$

In Equation 7, w is obtained from u and the elements of the matrix parameter Bk. Incidentally, "·" is the logical product, and "+" is the exclusive logical sum.

$$w1 = b_{11} \cdot u1 + b_{12} \cdot u2 + b_{13} \cdot u3 + \ldots + b_{18} \cdot u8 \quad \text{[Equation 7]}$$
$$w2 = b_{21} \cdot u1 + b_{22} \cdot u2 + b_{23} \cdot u3 + \ldots + b_{28} \cdot u8$$
$$w3 = b_{31} \cdot u1 + b_{32} \cdot u2 + b_{33} \cdot u3 + \ldots + b_{38} \cdot u8$$
$$\vdots$$
$$w8 = b_{81} \cdot u1 + b_{82} \cdot u2 + b_{83} \cdot u3 + \ldots + b_{88} \cdot u8$$

In the above described embodiment, with a table in which the number of pairs of the shortening parameters is as small as described above, it is possible to have plural fixed dedicated multiplication circuits to be selected and used. When the method of shortening the FEC code is top aligned with 16-bit process, it is possible to have dedicated circuits for xh(−1)k, xh(0)k, xh(1)k and select which circuits are used as xh(j)k, xh(j+1)k for each FEC frame, based on the FEC frame size and the FEC frame start position information. The selection of which circuits are used is equivalent to the selection of which address is read by the reference address calculator in FIG. 16.

Similarly, when the EFC frame size is 255 or 120 with 16 bit process, it is possible to have dedicated circuits for xh(−1)k, xh(0)k, xh(1)k, xh(134)k, xh(135)k, xh(136)k and select which circuits are used for each FEC frame.

According to the present invention, it is possible to provide an optical line terminal and an optical network terminal, which can process with the same forward error code even if the FEC frame size is different.

What is claimed is:

1. An optical line terminal comprising:
    a photoelectric converter;
    a PON transceiver; and
    a physical layer,
    wherein said PON transceiver includes an error correction code encoder including:
        a shortening compensation parameter table showing corresponding relation between a forward error correction code frame size and shortening compensation parameters; and
        a shortening compensation calculator for receiving input data, obtaining the shortening compensation parameters from the shortening compensation parameter table in accordance with the forward error correction code frame size, and calculating compensated data based on the input data and the shortening compensation parameters.

2. The optical line terminal according to claim 1, wherein said error correction code encoder further includes a check bit calculator and a check bit insertion part.

3. An optical line terminal comprising:
    a photoelectric converter;
    a PON transceiver; and
    a physical layer,
    wherein said PON transceiver includes an error correction code encoder including a shortening compensation calculator for receiving input data, obtaining shortening compensation parameters from a shortening compensation parameter table showing corresponding relation between a forward error correction code frame size and the shortening compensation parameters, and calculating compensation data by selecting an appropriate combination of multiplication circuits from a plurality of combinations of multiplication circuits.

4. The optical line terminal according to claim 3, wherein said error correction code encoder further includes a check bit calculator and a check bit insertion part.

5. An optical network terminal comprising:
    a photoelectric converter;
    a PON transceiver; and
    a physical layer,
    wherein said PON transceiver includes an error correction code encoder including:
        a shortening compensation parameter table showing corresponding relation between a forward error correction code frame size and shortening compensation parameters; and
        a shortening compensation calculator for receiving input data, obtaining the shortening compensation parameters from the shortening compensation parameter table in accordance with the forward error correction code frame size, and calculating compensated data based on the input data and the shortening compensation parameters.

6. The optical network terminal according to claim 5, wherein said error correction encoder further includes a check bit calculator and a check bit insertion part.

7. An optical network terminal comprising:
a photoelectric converter;
a PON transceiver; and
a physical layer,
wherein said PON transceiver includes an error correction code encoder including a shortening compensation calculator for receiving input data, obtaining shortening compensation parameters from a shortening compensation parameter table showing corresponding relation between a forward error correction code frame size and the shortening compensation parameters, and calculating compensation data by selecting an appropriate combination of multiplication circuits from a plurality of combinations of multiplication circuits.

8. The optical network terminal according to claim 7, wherein said error correction code encoder further includes a check bit calculator and a check bit insertion part.

* * * * *